(12) United States Patent
Chang et al.

(10) Patent No.: US 7,002,414 B2
(45) Date of Patent: Feb. 21, 2006

(54) DIGITAL ADJUSTABLE CHIP OSCILLATOR

(75) Inventors: Chia-Yang Chang, Taipei (TW);
Po-Chang Chen, Lujhou (TW);
Yang-Han Lee, Jhongli (TW);
Ching-Yuan Yang, Miaoli (TW)

(73) Assignee: Princeton Technology Corp., Taipei (TW)

( * ) Notice: Subject to any disclaimer, the term of this patent is extended or adjusted under 35 U.S.C. 154(b) by 20 days.

(21) Appl. No.: 10/688,516

(22) Filed: Oct. 17, 2003

(65) Prior Publication Data

US 2004/0090273 A1 May 13, 2004

(30) Foreign Application Priority Data

Nov. 8, 2002 (TW) ............................... 91132927 A

(51) Int. Cl.
*H03L 7/00* (2006.01)
(52) U.S. Cl. .......................................... 331/1 A; 331/25
(58) Field of Classification Search ................ 331/1 R, 331/16–18, 34, 1 A, 177 R, 117 D, 175–176, 331/185, 186; 327/538, 539
See application file for complete search history.

(56) References Cited

U.S. PATENT DOCUMENTS

| | | | |
|---|---|---|---|
| 5,552,748 A * | 9/1996 | O'Shaughnessy | 331/1 A |
| 5,912,595 A * | 6/1999 | Ma et al. | 331/117 D |
| 6,198,353 B1 * | 3/2001 | Janesch et al. | 331/16 |
| 6,225,856 B1 * | 5/2001 | Toth | 327/539 |
| 6,747,497 B1 * | 6/2004 | Ingino, Jr. | 327/157 |
| 6,753,739 B1 * | 6/2004 | Mar et al. | 331/176 |
| 6,778,033 B1 * | 8/2004 | Wong et al. | 331/185 |

\* cited by examiner

*Primary Examiner*—Minh Nguyen
(74) *Attorney, Agent, or Firm*—Thomas, Kayden, Horstemeyer & Risley

(57) ABSTRACT

A digital adjustable chip oscillator comprises a voltage control oscillator, a reference voltage circuit, a voltage regulation circuit, a digital tuning circuit, a frequency detector and a programmable controller. The oscillator generates an oscillation signal and receives a control voltage and an operating voltage from the voltage regulation circuit and the reference voltage circuit to stabilize and adjust the frequency of oscillation signal. The digital tuning circuit receives a digital code stored in a programmable memory to adjust the control voltage. The frequency detector detects and compares the frequency of oscillation signal with a first and second frequency, wherein when the frequency of the oscillation signal lies between the first and second frequency, the frequency detector outputs a high voltage signal and otherwise the frequency detector outputs a low voltage signal. The programmable controller receives the high voltage signal to stop a programmable counter to acquire the digital code.

10 Claims, 48 Drawing Sheets

PO2

DIGITAL ADJUSTABLE CHIP OSCILLATOR

BACKGROUND OF THE INVENTION

1. Field of the Invention

The present invention relates in general to an oscillator, and more specifically to a digital adjustable chip oscillator.

2. Description of the Related Art

In wireless communication systems, there is a necessity for the phase-lock loop circuit to synchronize with signals from other circuits. In general, the phase-lock loop circuit needs a quartz oscillator serving as an oscillation source. Under development of the integrated circuits technology, it is feasible to lower the cost by integrating external components into a chip and decrease the number of external pins needed. Therefore, there is a necessity to provide a digital adjustable chip oscillator having digital tuning function, self-test systems, and power save modes.

SUMMARY OF THE INVENTION

The present invention provides a digital adjustable chip oscillator comprising a voltage control oscillator generating an oscillation signal, receiving a control voltage to adjust the frequency of the oscillation signal, and receiving an operating voltage to stabilize the frequency of the oscillation signal, a reference voltage circuit generating a reference voltage, a voltage regulation circuit receiving the reference voltage and generating the operating voltage, a digital tuning circuit receiving a digital code to adjust the control voltage and receiving the operating voltage to stabilize the control voltage, a frequency detector receiving the oscillation signal, a first reference signal with a first frequency, and a second reference signal with a second frequency, wherein when the frequency of the oscillation signal lies between the first frequency and the second frequency, the frequency detector outputs a high voltage comparison signal, otherwise the frequency detector outputs a low voltage comparison signal, a programmable counter receiving a clock signal to trigger the counting and generating the digital code, a programmable controller receiving the high voltage comparison signal to generate an enable signal directing the frequency detector to hold the high voltage comparison signal and directing the programmable counter to stop counting and hold the digital code, and a programmable memory receiving the enable signal to record the digital code.

The present invention provides another digital adjustable chip oscillator comprising: a voltage control oscillator generating an oscillation signal and receiving a control voltage to control the frequency of the oscillation signal, a frequency-to-voltage converter receiving the oscillation signal and generating a loop voltage according to an operating voltage and a first voltage, an active comparison filter receiving the loop voltage, receiving a second voltage, and generating the control voltage, and a first programmable controller receiving a first digital code, receiving the operating voltage, and generating the second voltage.

BRIEF DESCRIPTION OF THE DRAWINGS

The following detailed description, given by way of example and not intended to limit the invention solely to the embodiments described herein, will best be understood in conjunction with the accompanying drawings, in which:

FIG. 6 is a schematic diagram illustrating the digital tuning circuit 80a;

DETAILED DESCRIPTION OF THE INVENTION

The following detailed description, given by way of example and not intended to limit the invention solely to the embodiments described herein, will best be understood in conjunction with the accompanying drawings, in which:

The First Embodiment

Figure 1:
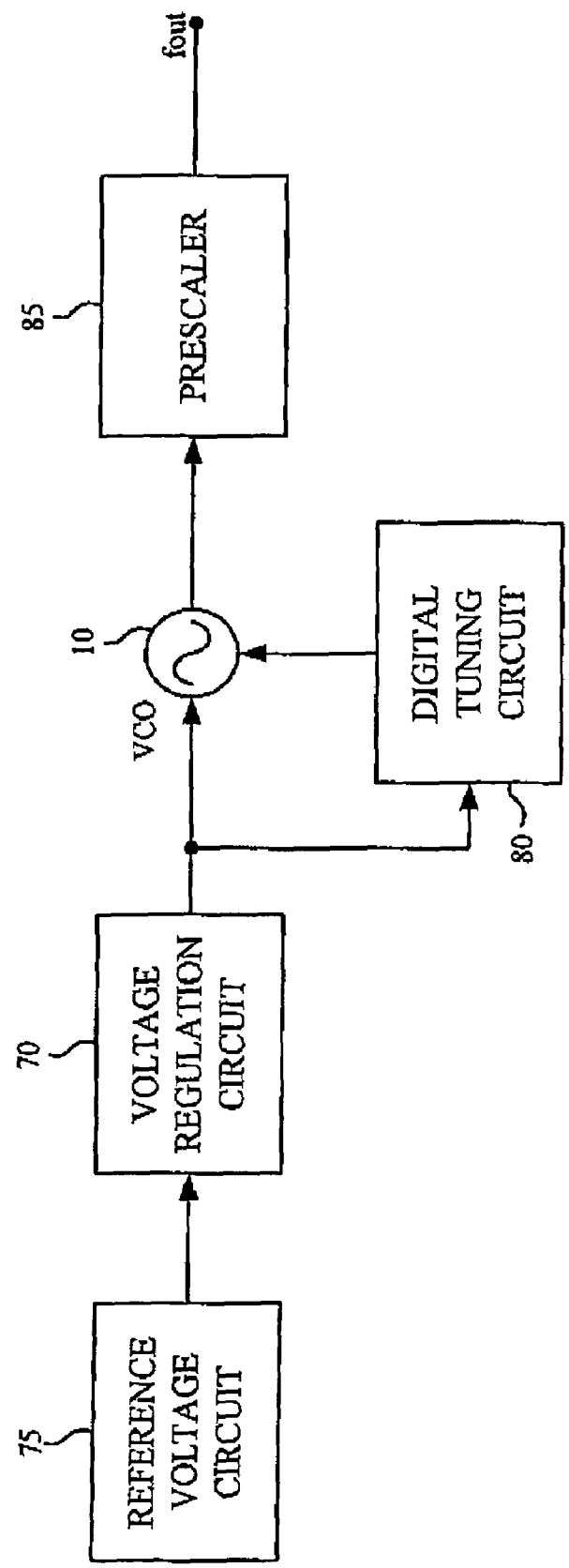
FIG. 1 is a block diagram illustrating the digital adjustable chip oscillator in the first embodiment.

FIG. 1 is a block diagram illustrating the digital adjustable chip oscillator in the first embodiment. As shown in FIG. 1, the digital adjustable chip oscillator comprises a voltage control oscillator 10, a voltage regulation circuit 70, a reference voltage circuit 75, a digital tuning circuit 80, and a prescaler 85. The voltage control oscillator is a relaxation oscillator.

Figure 2:
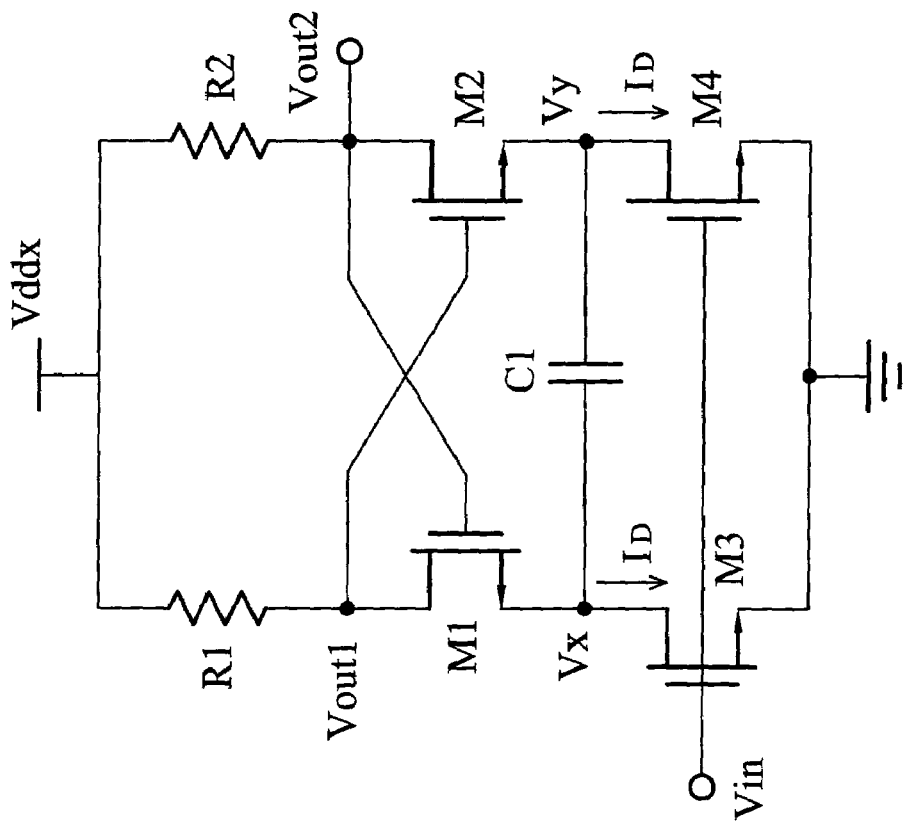
FIG. 2 is a schematic diagram illustrating the circuit of the voltage control oscillator 10.

FIG. 2 is a schematic diagram illustrating the circuit of the voltage control oscillator 10. The transistors M1 and M2 form a positive loop circuit to provide a fast switch. M1 and M2 conduct currents mutually to cut off the positive loop circuit in half period. The capacitance C of the capacitor C1 is used to control the discharging time.

The resistances R of the resistors R1 and R2 are used to control the amplitudes of the oscillation signals Vout1 and Vout2. The currents ID of the transistors M3 and M4 are adjustable.

Figure 3:
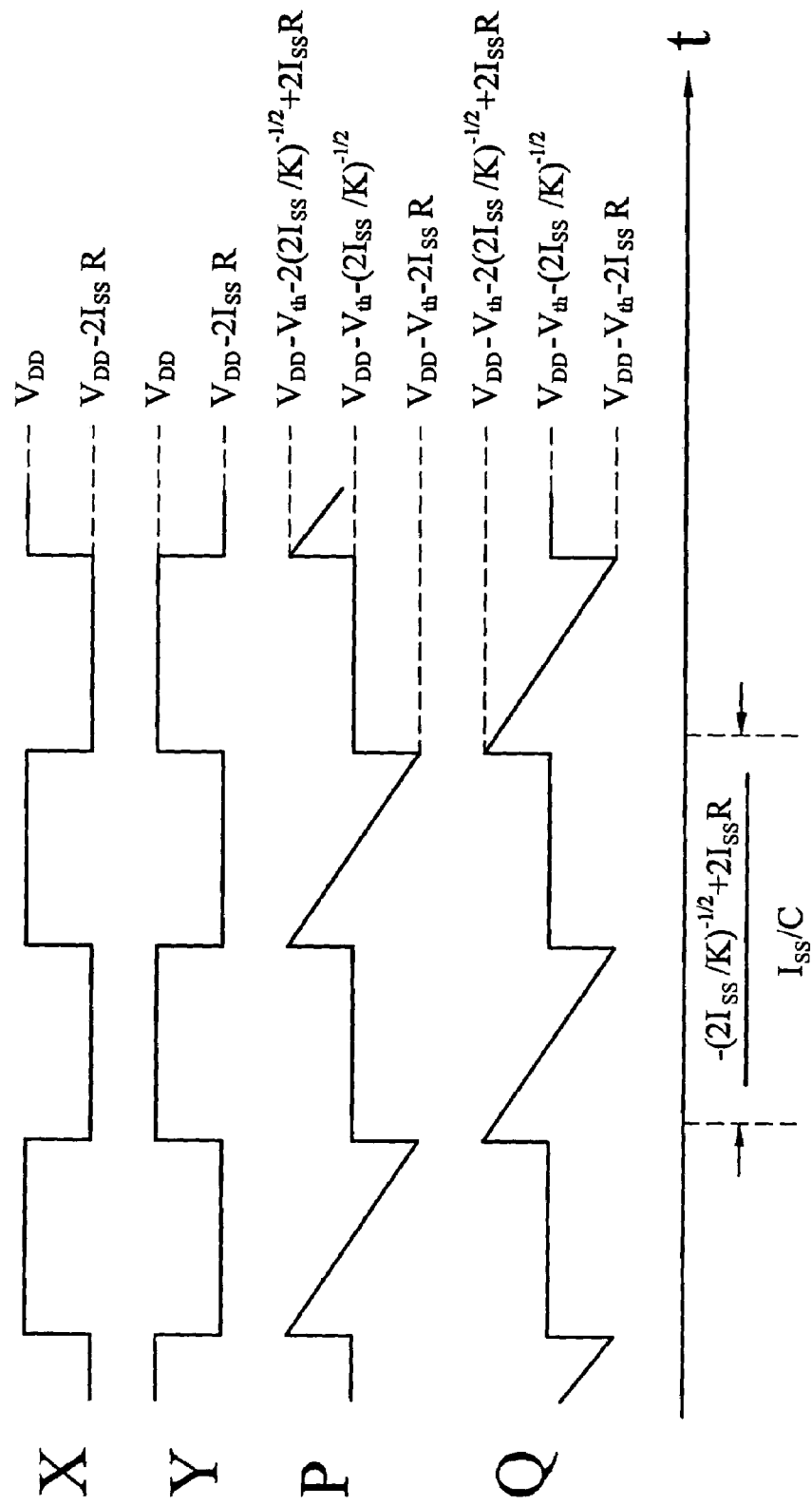
FIG. 3 is a graph illustrating the voltage-to-time wave of the voltage control oscillator 10.

FIG. 3 is a graph illustrating the voltage-to-time wave of the voltage control oscillator 10. In state i, the transistor M1 is turned off and the transistor M2 is turn on. The voltage of the oscillation signal Vout1 is Vddx, the current of the capacitor C1 is the current ID of the transistor M3, so that the current of the transistor M2 is 2ID, the sum of the current of the capacitor C1 and the current of the transistor M4. Therefore the voltage of the oscillation signal Vout2 is Vddx−2IDR. If 2IDR is smaller than the threshold voltage Vth of the transistor M2, M2 will work in the saturation area. The voltage of node Y is $V_y = V_{ddx} - V_{th} - \sqrt{2I_D/K}$ wherein K is the conductance parameter of the transistor M2. The discharging velocity of node VX is 2ID/C. When the voltage VX lowers to the value $V_{ddx} - 2I_D R - V_{th}$, in other words when the gate-to-source voltage difference of the transistor M1 reaches the threshold voltage, M1 will be turned on rapidly, the oscillation signal Vout1 will be lowered, the transistor M2 will be turned off, and then the voltage control oscillator 10 will work in state ii. The voltage control oscillator 10 works in state ii in a similar but symmetric way compared to state i. Derived from FIG. 3, the oscillation period T is $$T = \frac{-\sqrt{2I_D/K} + I_D R}{I_D/C}, \quad (1)$$

and the oscillation frequency f is $$f = \frac{1}{T} = \frac{1}{C(2R - \sqrt{2/KI_D})}. \quad (2)$$

Thus the oscillation frequency f can be adjusted by the resistance R1, the resistance R2, the capacitance C1, and the current ID. The voltage Vin is input into the gates of the transistors M3 and M4 to control the current ID.

Figure 4:
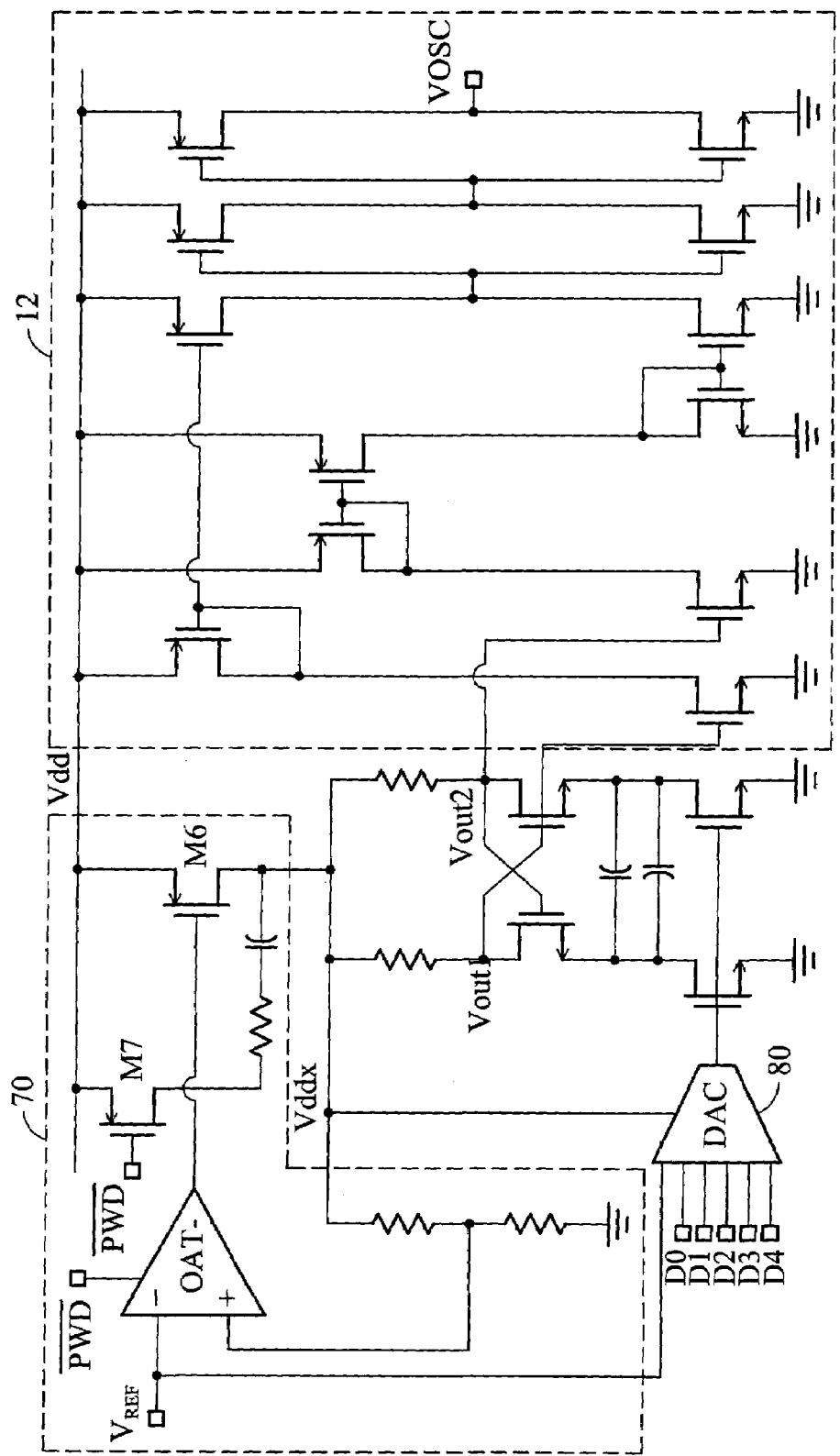
FIG. 4 is a schematic diagram illustrating the circuit of the digital adjustable chip oscillator.

FIG. 4 is a schematic diagram illustrating the circuit of the digital adjustable chip oscillator. The output buffer 12 comprising a buffer and a double-end-to-single-end converter converts the oscillation signals Vout1 and Vout2 to a single-end voltage large enough to drive the prescaler and other logic circuits, isolates the voltage control oscillator 10 with other circuits, provides enough power to the next-stage circuits, and avoids affecting the normal operation of the voltage control oscillator 10. As shown in FIG. 4, the gate of the transistor M7 receives a power save signal PWD, turns off the transistor M6, and therefore turns off the voltage control oscillator 10. The voltage regulation circuit 70 provides a stable operating voltage Vddx without effects of temperature and voltage source. The stable operating voltage Vddx is used as the bias of the voltage control oscillator 10 to stabilize the oscillation frequency.

Figure 5A:
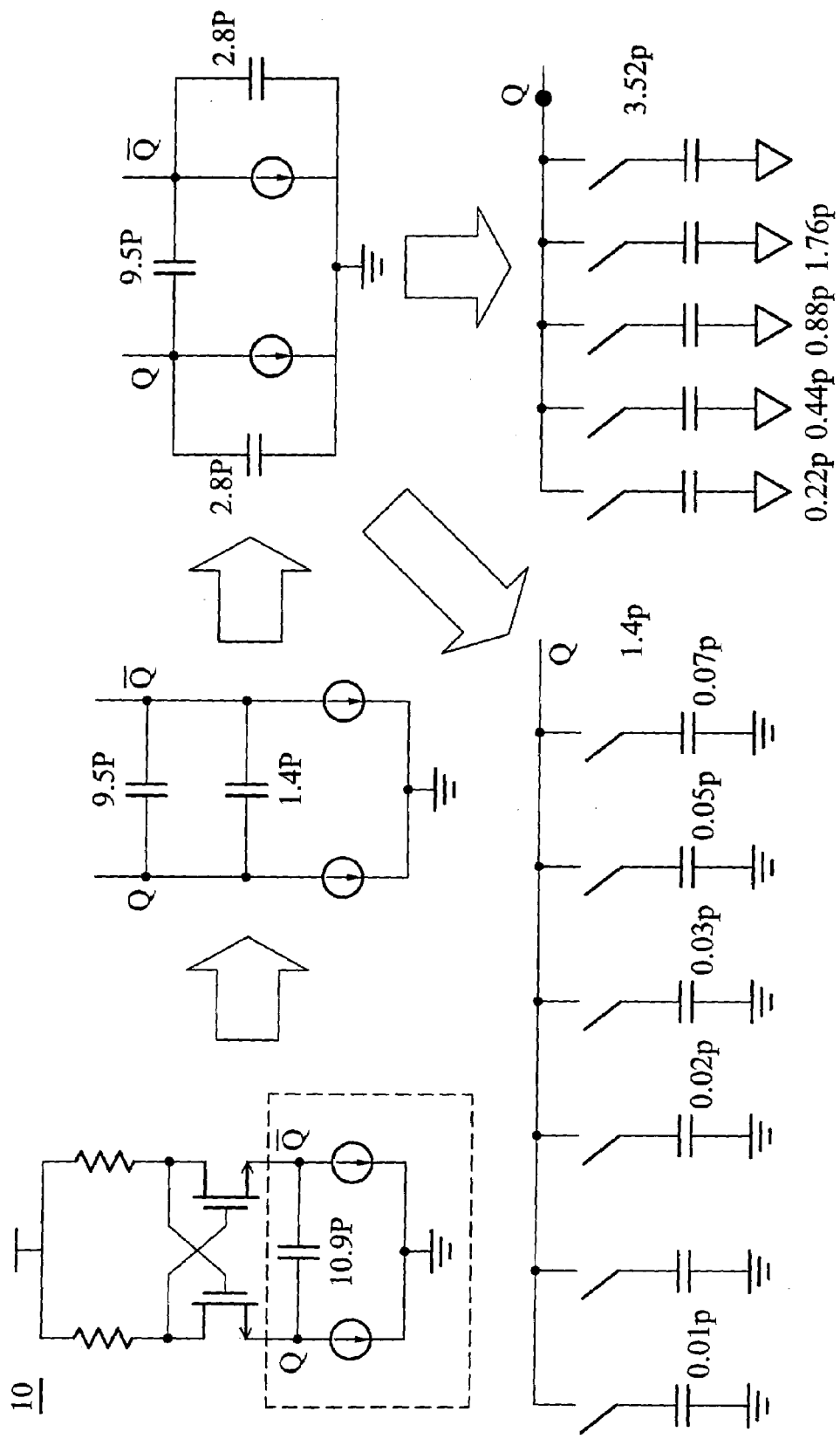
FIG. 5A is a schematic diagram illustrating the switch capacitance voltage control oscillator 10.

FIG. 5A is a schematic diagram illustrating the switch capacitance voltage control oscillator 10. The switches SWC1–SWCn are used to adjust the coupling capacitance of the capacitor C1 in FIG. 2 and control the oscillation frequency.

Figure 5B:
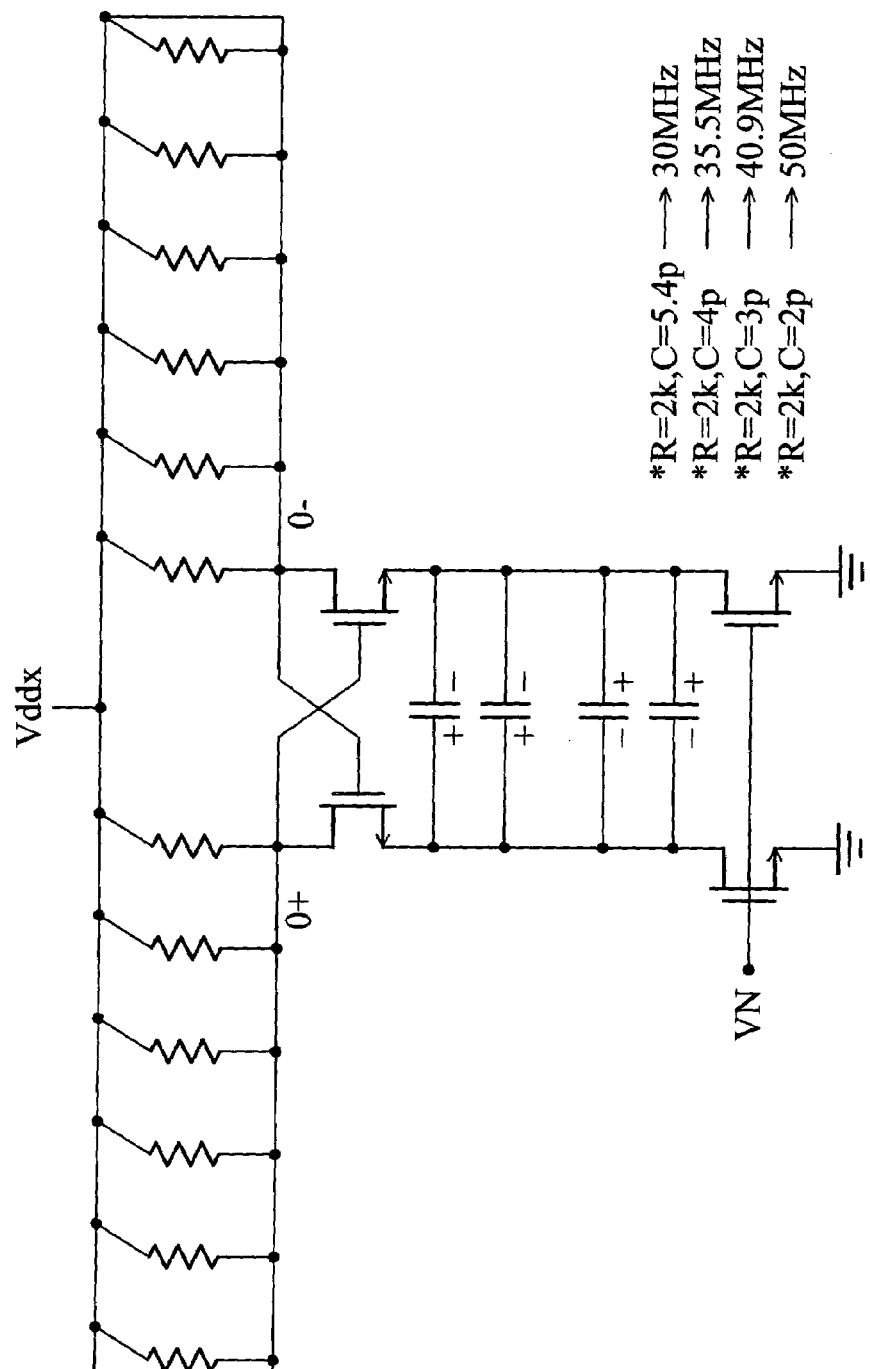
FIG. 5B is a schematic diagram illustrating the switch resistance voltage control oscillator 10.

FIG. 5B is a schematic diagram illustrating the switch resistance voltage control oscillator 10. The switches SWR1–SWRn are used to adjust the resistances of the resistors R1 and R2 in FIG. 2 and control the oscillation frequency.

Figure 6:
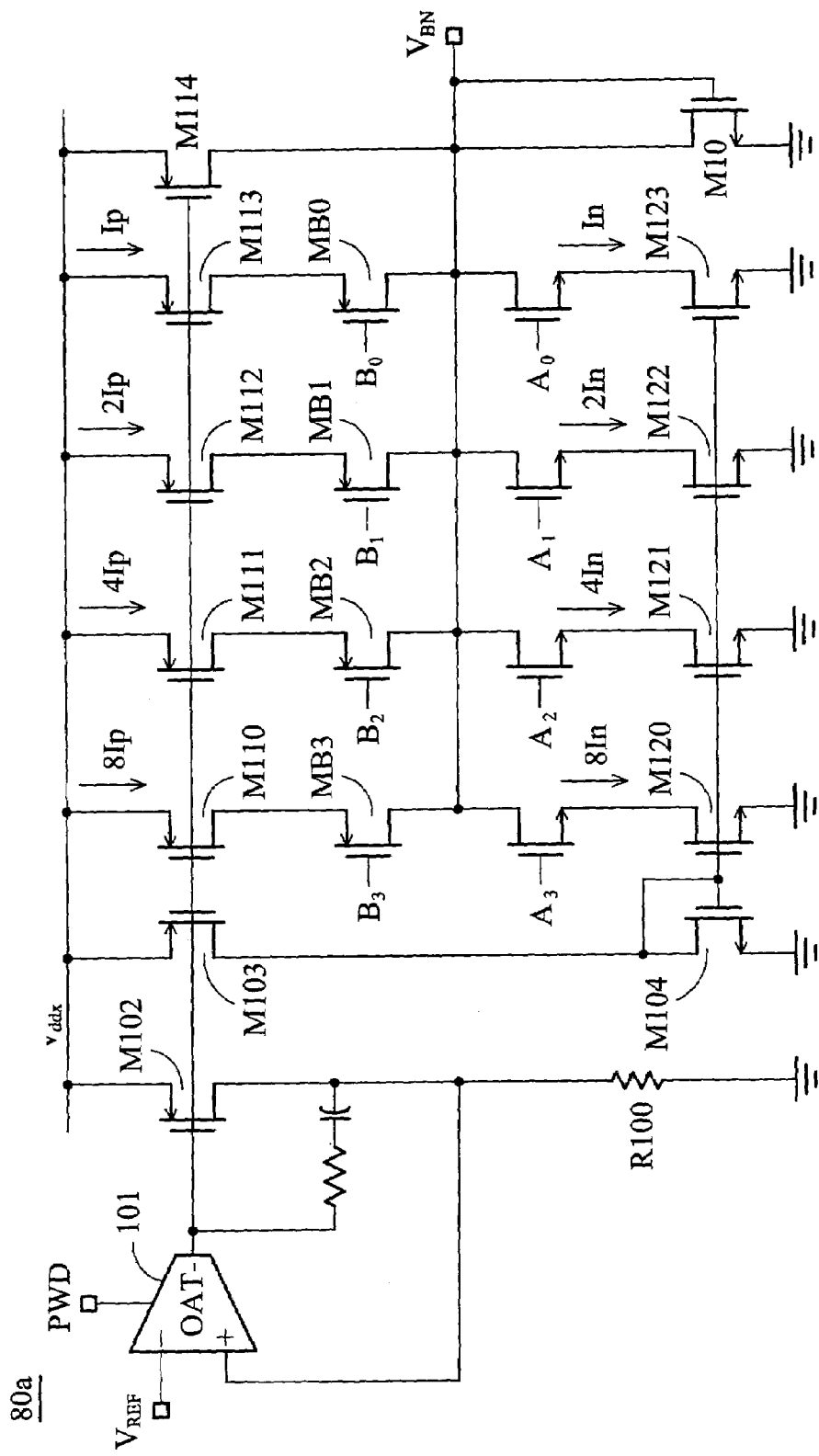

FIG. 6 is a schematic diagram illustrating the digital tuning circuit 80*a*. The output end VBN is coupled to the control voltages Vin of the transistors M3 and M4 of the voltage control oscillator 10. By adjusting the input current of the transistor M10, the transistors M10, M3, and M4 work together as a current mirror to control the voltage of the output end VBN, control the output currents of the transistors M3 and M4 of the voltage control oscillator 10, and therefore adjust the oscillation frequency of the voltage control oscillator 10. The digital tuning circuit 80 works as a digital-to-analog converter (DAC). By effects of the negative loop operation of the reference voltage Vref and the differential amplifier 101, the digital tuning circuit 80 directs the reference current of the transistor M102 be Vref/R. In cooperation with the current mirror comprising the transistors M102, M103, and M104, the digital tuning circuit 80 proportions the current of the output end VBN to the reference current. The transistors M110, M111, M112, and M113 work together as a charge current mirror to provide charge currents 8Ip, 4Ip, 2Ip, and Ip coupled to the output end VBN by connection of switch transistors MB0, MB1, MB2, and MB3. The digital codes B0, B1, B2, and B3 are used to select the corresponding bits of the charge currents.

The operating voltages of the transistors M102, M103, M110, M111, M112, M113, and M114 are provided by the output end voltage Vddx of the voltage regulation circuit 70. Vddx is a stable voltage source used to stabilize the current of the digital tuning circuit 80 and the output end voltage VBN of the digital tuning circuit 80 and further stabilize the oscillation frequency of the voltage control oscillator 10. The transistors M120, M121, M122, and M123 work together as a discharge current mirror to provide discharge currents 8In, 4In, 2In, and In coupled to the output end VBN by connection of switch transistors MA0, MA1, MA2, and MA3. The digital codes A0, A1, A2, and A3 are used to select the corresponding bits of the discharge currents. The transistor M10 increases the output current by adjusting the sign codes B3, B2, B1, and B0. The transistor M10 decreases the output current by adjusting the sign codes A3, A2, A1, and A0.

Figure 7:
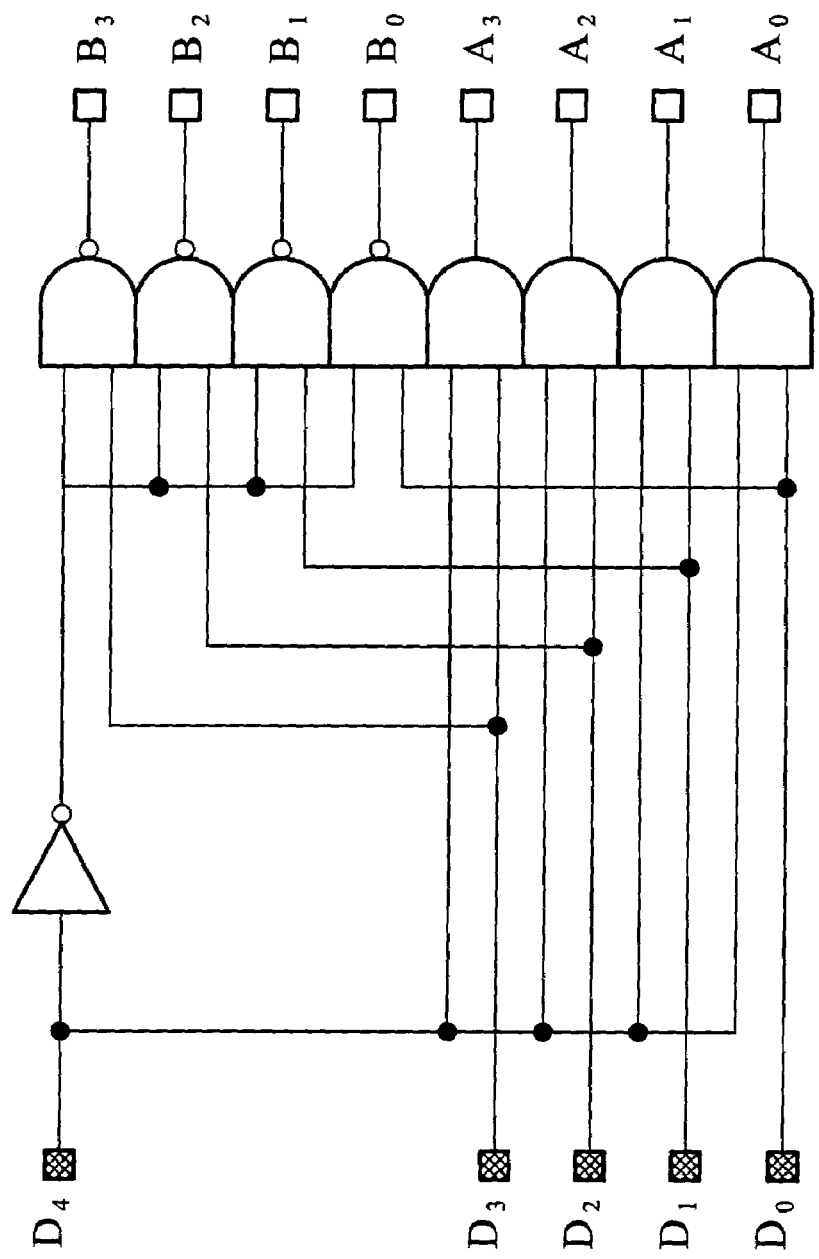
FIG. 7 is a schematic diagram illustrating the circuit of the digital-code-to-sign-code decoder 126.

FIG. 7 is a schematic diagram illustrating the circuit of the digital-code-to-sign-code decoder 126. The decoder 126 converts the digital codes D4, D3, D2, D1, and D0 to the sign codes B3, B2, B1, B0, A3, A2, A1, and A0. By way of DAC current mode, the digital tuning circuit 80 adjusts the control voltage of the voltage control oscillator 10. The operating voltage of the digital tuning circuit 80 is provided by the voltage regulation circuit 70, so that the control voltage of the voltage control oscillator 10 is stable and linear. The oscillation frequency shift caused by the manufacturing process can be compensated to only 1 percentage of frequency error by the digital tuning circuit 80.

Figure 8:
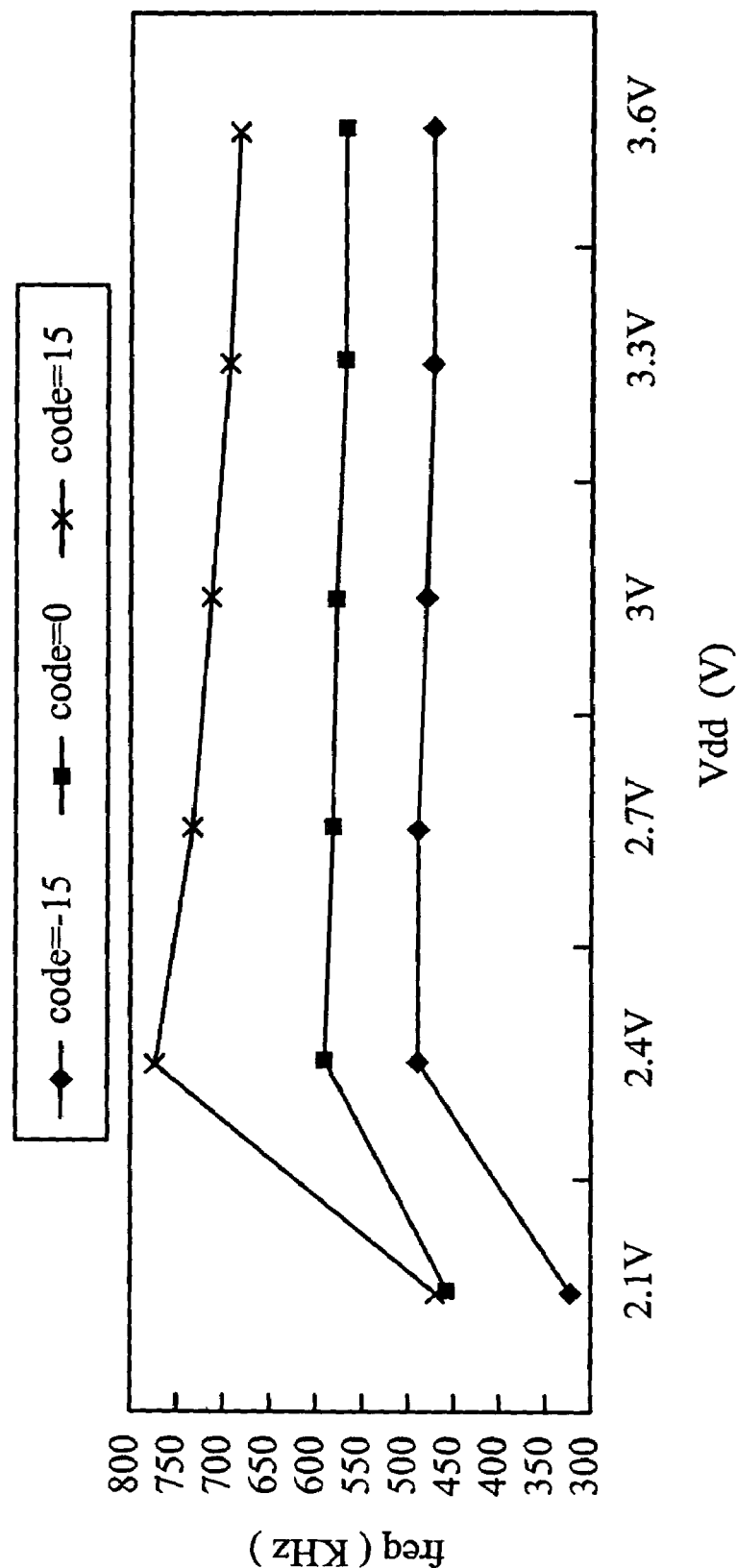
FIG. 8 is a graph illustrating the test results of the voltage control oscillator 10 when the voltage source varies.

FIG. 8 is a graph illustrating the test results of the voltage control oscillator 10 when the voltage source varies. As shown in FIG. 8, when the digital code is −15, 0, or 15, the oscillation frequency of the voltage control oscillator 10 is almost unaffected by the voltage source Vdd.

Figure 9:
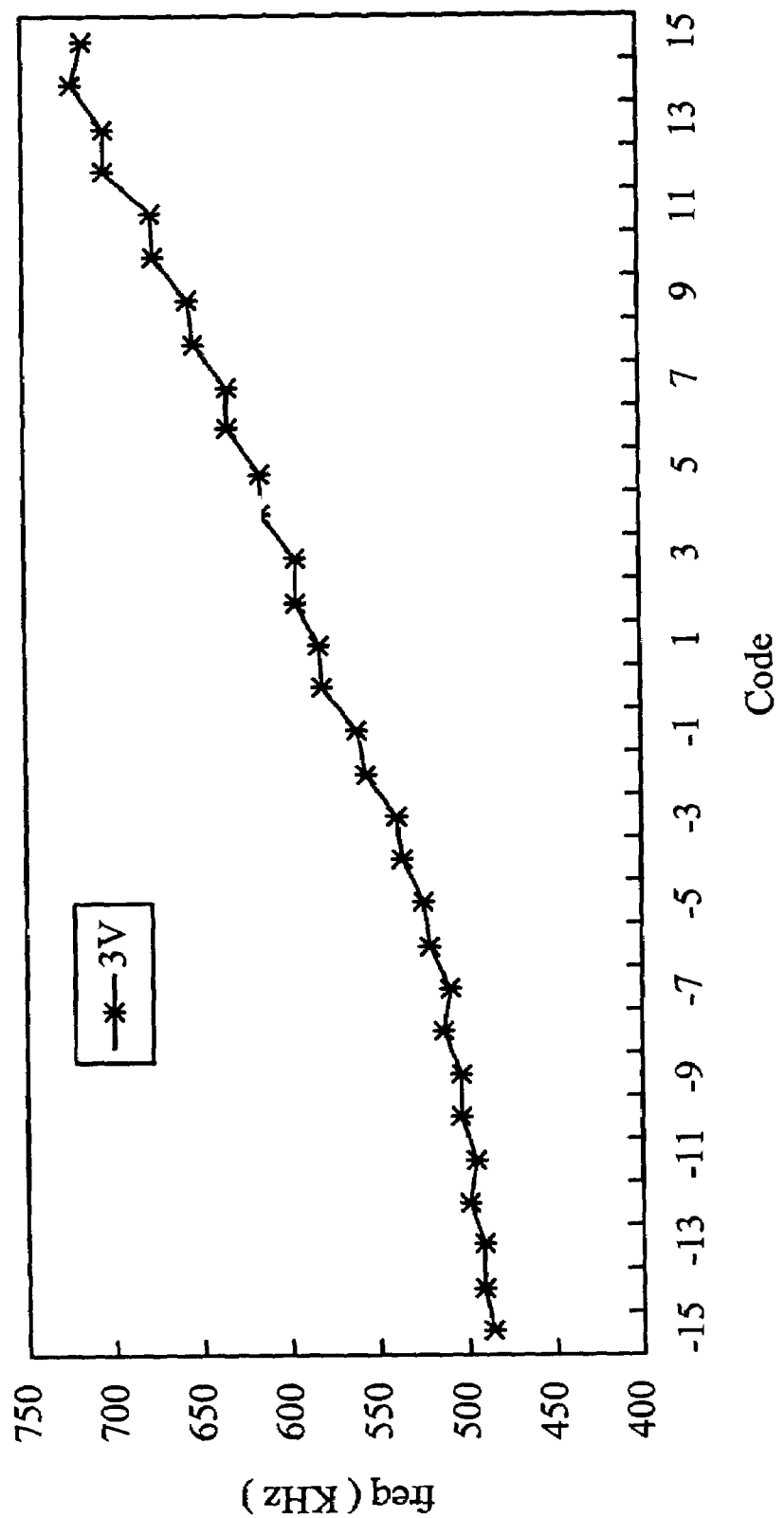
FIG. 9 is a graph illustrating the test results of the voltage control oscillator 10 when the digital code varies.

FIG. 9 is a graph illustrating the test results of the voltage control oscillator 10 when the digital code varies.

Figure 10:
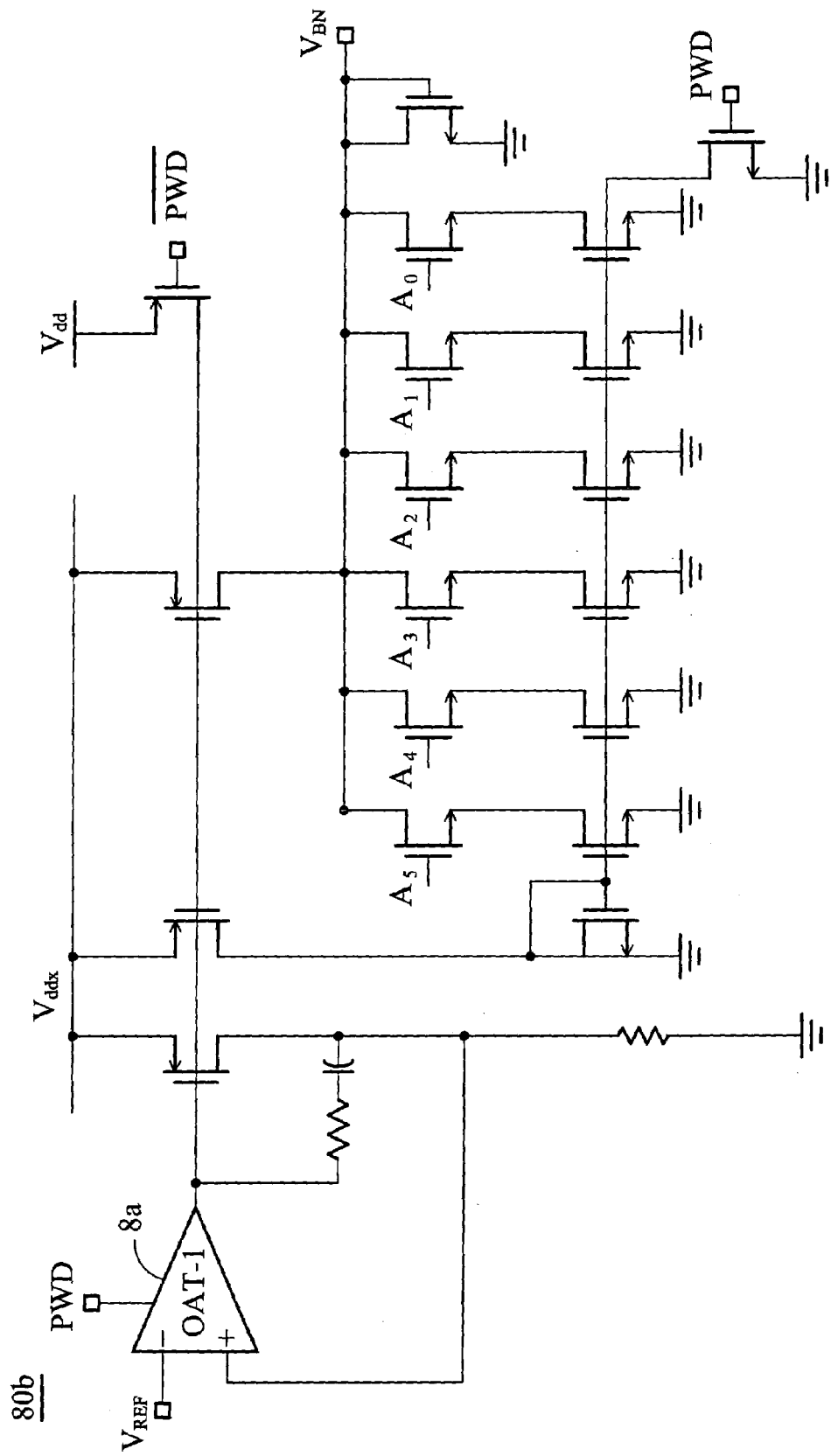
FIG. 10 is a schematic diagram illustrating the digital tuning circuit 80b.

FIG. 10 is a schematic diagram illustrating the digital tuning circuit 80b. The function of the digital tuning circuit 80b is similar to that of the digital tuning circuit 80a in FIG. 6 except that the digital codes A5, A4, A3, A2, A1, and A0 used to adjust the output currents can be operated in only single direction. In other words, the output currents can only be increased by adjusting the digital codes A5, A4, A3, A2, A1, and A0. Both the digital tuning circuits 80a and 80b can be applied to the first embodiment herein.

Figure 11:
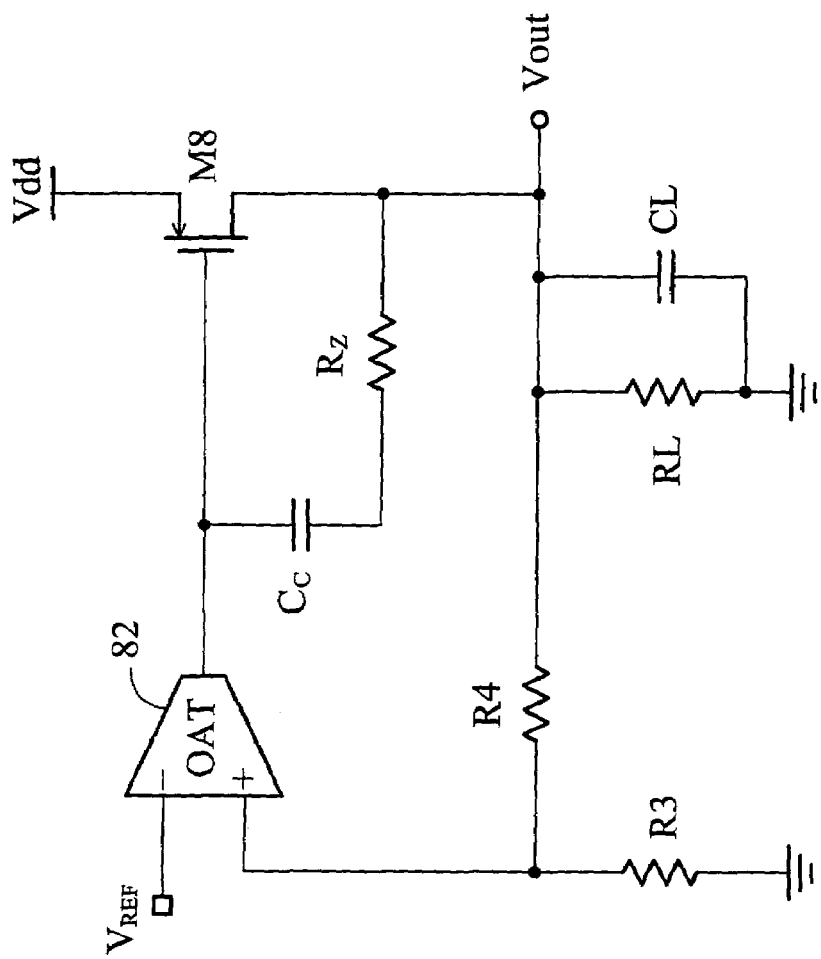
FIG. 11 is a schematic diagram illustrating the voltage regulation circuit 70.

FIG. 11 is a schematic diagram illustrating the voltage regulation circuit 70. The voltage regulation circuit 70 provides a stable voltage without effects of temperature and voltage source Vdd. The stable voltage is provided to both the voltage control oscillator 10 and the digital tuning circuit 80. The voltage regulation circuit 70 comprises an operational transconductance amplifier 82, a transistor M8, and a loop circuit. The loop circuit comprises a loop resistor R3, a loop resistor R4, a compensation resistor Rz, and a compensation capacitor Cc. The loop circuit detects the output current of the transistor M8 and outputs the loop voltage to the operational transconductance amplifier 82. In cooperation with the reference voltage Vref and the loop circuit, the voltage regulation circuit 70 stabilizes the output end voltage coupled to the voltage source Vddx of the voltage control oscillator 10. The transistor M8 is a PMOS transistor, so that the highest voltage range of the output voltage Vddx can be higher.

Figure 12:
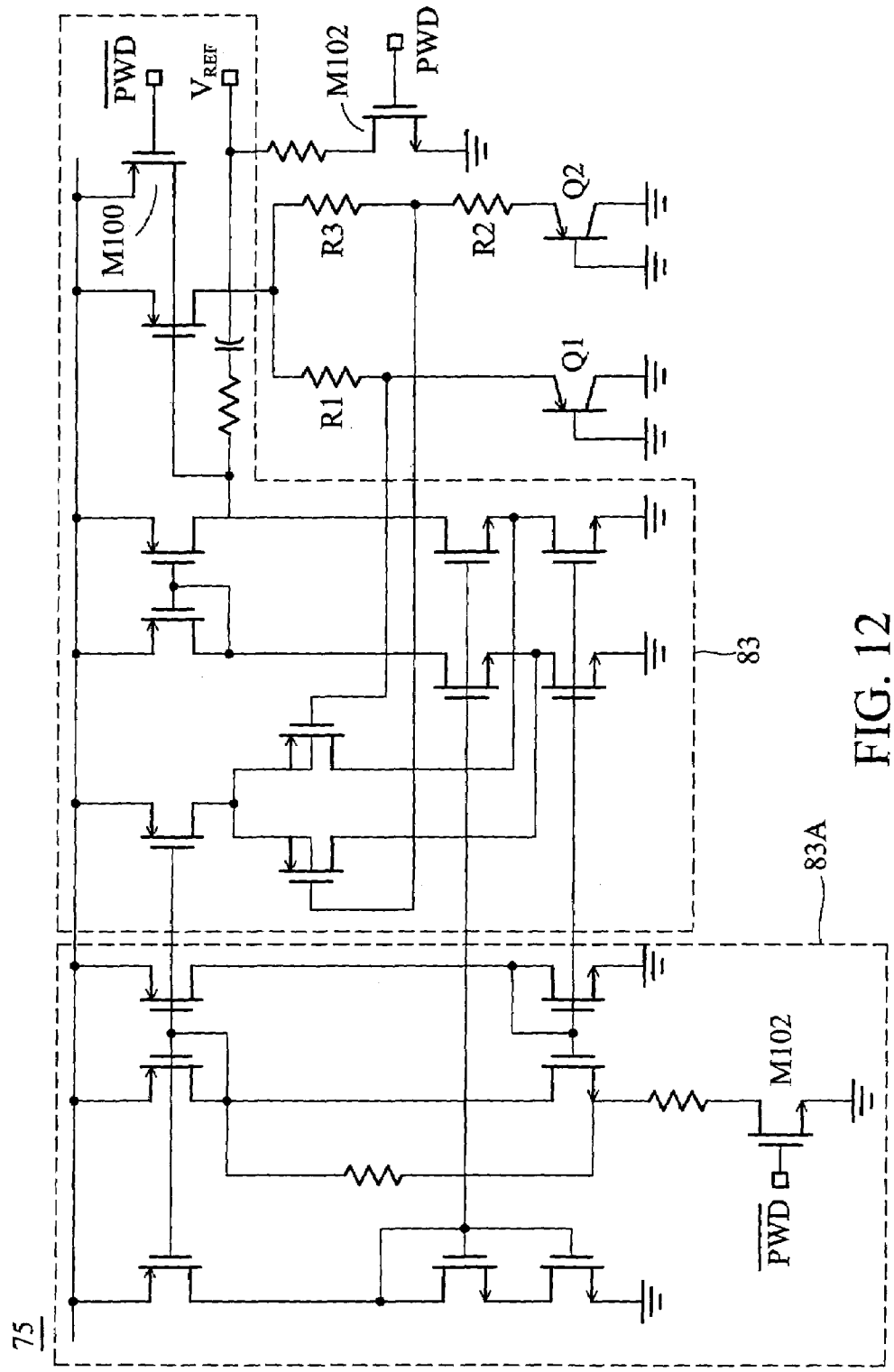
FIG. 12 is a schematic diagram illustrating the reference voltage circuit 75.

FIG. 12 is a schematic diagram illustrating the reference voltage circuit 75. The reference voltage circuit 75 is a bandgap reference voltage circuit. The reference voltage circuit 75 provides a stable reference voltage Vref without effects of temperature and voltage source Vdd. The effects of the temperature can be lowered mainly because of the characteristics of the negative temperature parameter of the base-emitter interface voltage VEB of the BJT Q1 and the characteristics of the positive temperature parameter of $\Delta E_{EB}$. When the BJT Q1 and Q2 operate in different current densities of bias, the amplifier 83 detects the voltage difference $\Delta E_{EB}$ and gets fixed voltage kT/q1n(R3/R1) with positive temperature parameter. The current density of bias can be decided by the ratio of resistances R3 to R1. By the ratio of resistances R3 to R2, the amplifier 83 decides the fixed voltage enlargement factor of the positive temperature parameter used to balance the negative temperature parameter of the base-emitter interface voltage of the BJT Q1, thereby obtaining a reference voltage Vref. The reference voltage Vref=V+(R3/R2)kT/q1n(R3/R1). The currents flowing through the resistors R1 and R3 are the same, so that the base areas A1 and A2 of the transistors Q1 and Q2 are in an inverse proportion to the current densities of Q1 and Q2. The ratio of base areas A1 to A2 (A1:A2) is usually designed to be 1:3, 1:8, 1:15, 1:24, or others wherein the sum of the numerator and the denominator in each case is the square of a natural number. By this design method, the layout will be more symmetric. The bias circuit 83A provides the bias to the amplifier 83 to cut off the source in the power save mode wherein the gates of the PMOS transistor M100 and the NMOS transistor M102 are coupled to a power save signal PWD.

Figure 13:
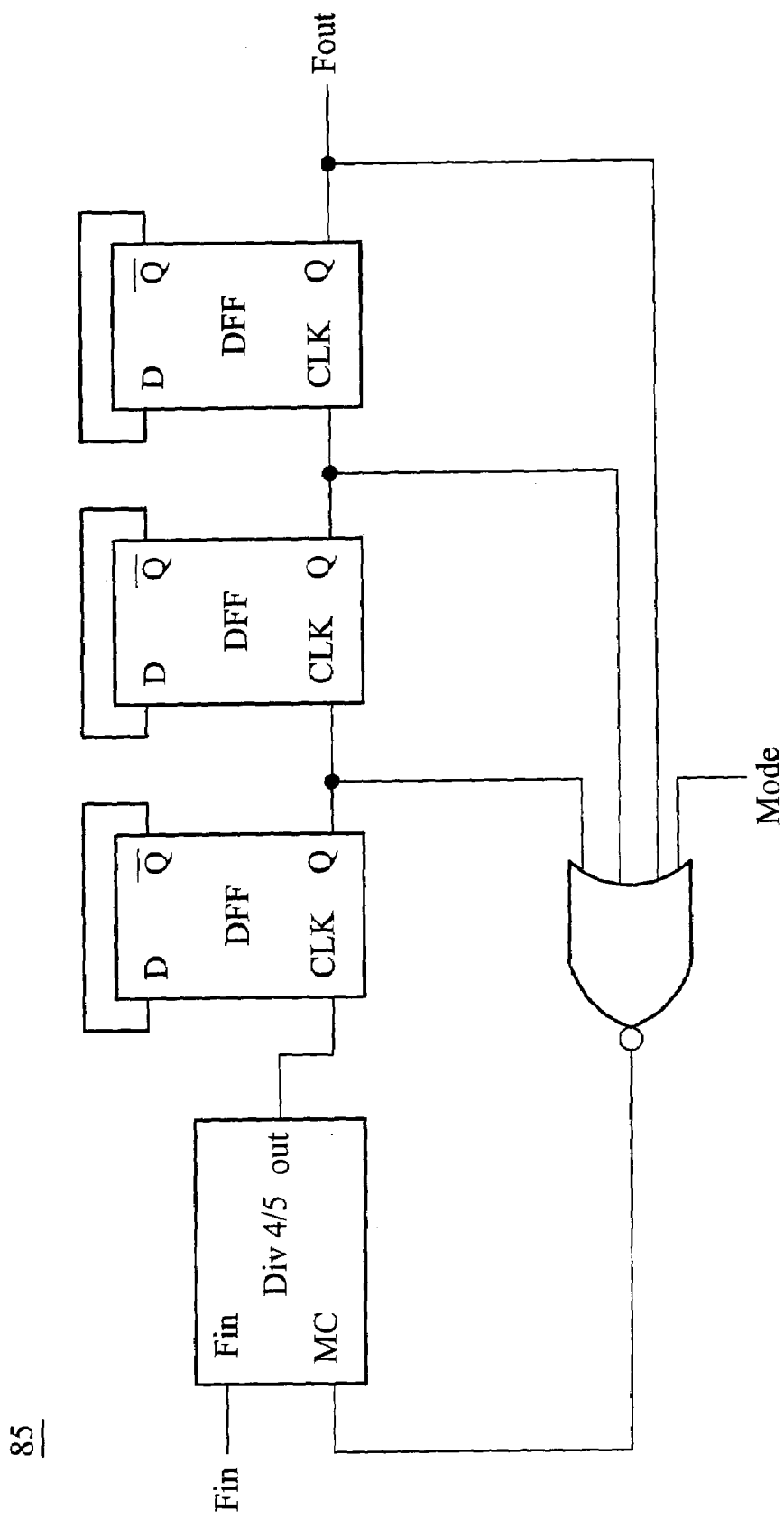
FIG. 13 is a schematic diagram illustrating the circuit of the prescaler 85.

FIG. 13 is a schematic diagram illustrating the circuit of the prescaler 85. The prescaler 85 comprises a division-by-4 or-5 circuit and the prescaler circuit having three D-type flip-flops (DFF). The prescaler controls the prescaler parameter by selecting modes.

Figure 14:
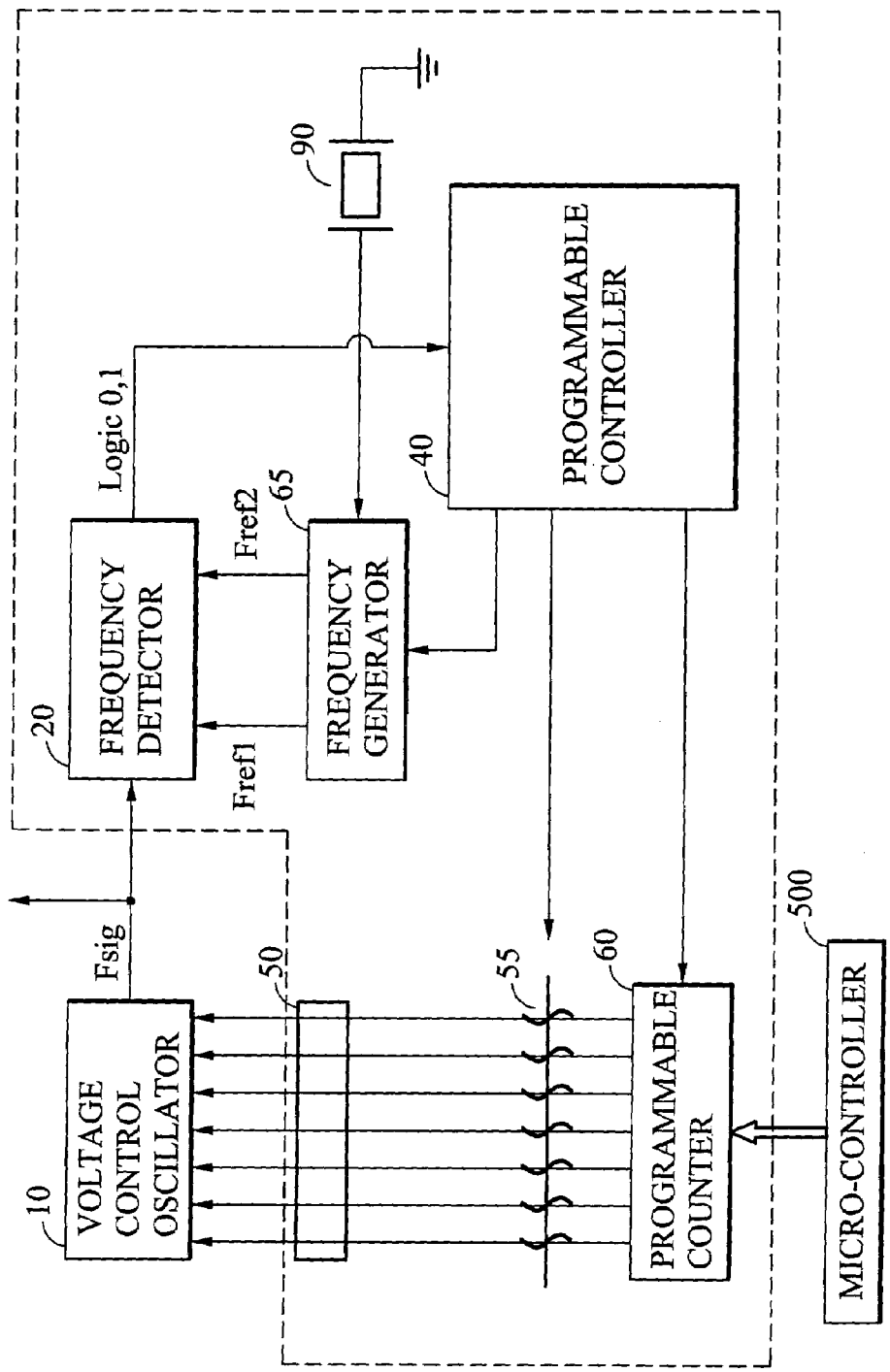
FIG. 14 is a block diagram illustrating the digital adjustable chip oscillator and the built-in self-test system.

FIG. 14 is a block diagram illustrating the digital adjustable chip oscillator and the built-in self-test system. The built-in self-test circuit is used to automatically adjust the frequency to meet the requirement. The built-in self-test system comprises a voltage control oscillator 10, a frequency detector 20, a frequency generator 65, a programmable controller 40, a programmable gate writer 50, a programmable fuse 55, and a programmable counter 60. Both the programmable gate writer 50 and the programmable fuse 55 can be used as the programmable memories herein. Both the programmable gate writer 50 and the programmable fuse 55 can write, read, and load the digital code to the frequency detector 20. The frequency detector 20 can select the desired frequency automatically by the signals from the controller.

Figure 15:
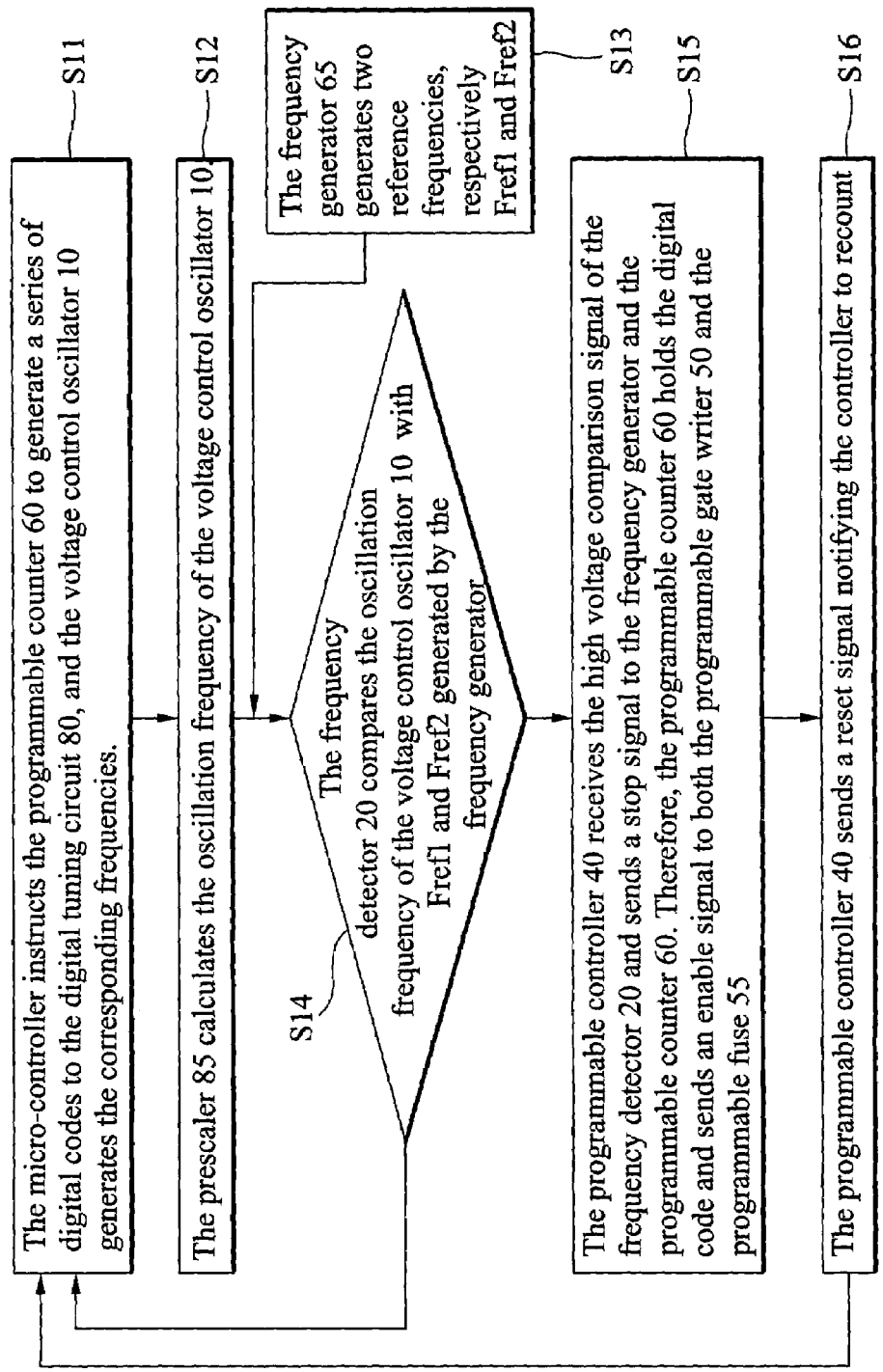
FIG. 15 is a flowchart illustrating the self-test system.

FIG. 15 is a flowchart illustrating the self-test system. In step S11, the micro-controller instructs the programmable counter 60 to generate a series of digital codes to the digital tuning circuit 80, and the voltage control oscillator 10 generates the corresponding frequencies. In step S12, the prescaler 85 calculates the oscillation frequency of the voltage control oscillator 10. In step S13, the frequency generator 65 generates two reference frequencies, respectively Fref1 and Fref2. In step S14, the frequency detector 20 compares the oscillation frequency of the voltage control oscillator 10 with Fref1 and Fref2 generated by the frequency generator. When the oscillation frequency lies between the preset reference frequencies Fref1 and Fref2, the frequency detector 20 will output a high voltage comparison signal, otherwise the frequency detector 20 will output a low voltage comparison signal. In step S15, the programmable controller 40 receives the high voltage comparison signal of the frequency detector 20 and sends a stop signal to the frequency generator and the programmable counter 60. Therefore, the programmable counter 60 holds the digital code and sends an enable signal to both the programmable gate writer 50 and the programmable fuse 55. Furthermore, the programmable gate writer 50 and the programmable fuse 55 will execute the writing operation and load the digital code to the digital tuning circuit 80. In step S16, the programmable controller 40 sends a reset signal notifying the controller to recount. Additionally, in step S11, when the programmable controller 40 receives the low voltage of the frequency detector 20, the programmable counter 60 will continue counting and generate the next digital code. Therefore, the voltage control oscillator 10 will generate the next oscillation frequency until the oscillation frequency is in the range of the reference frequency.

Figure 16:
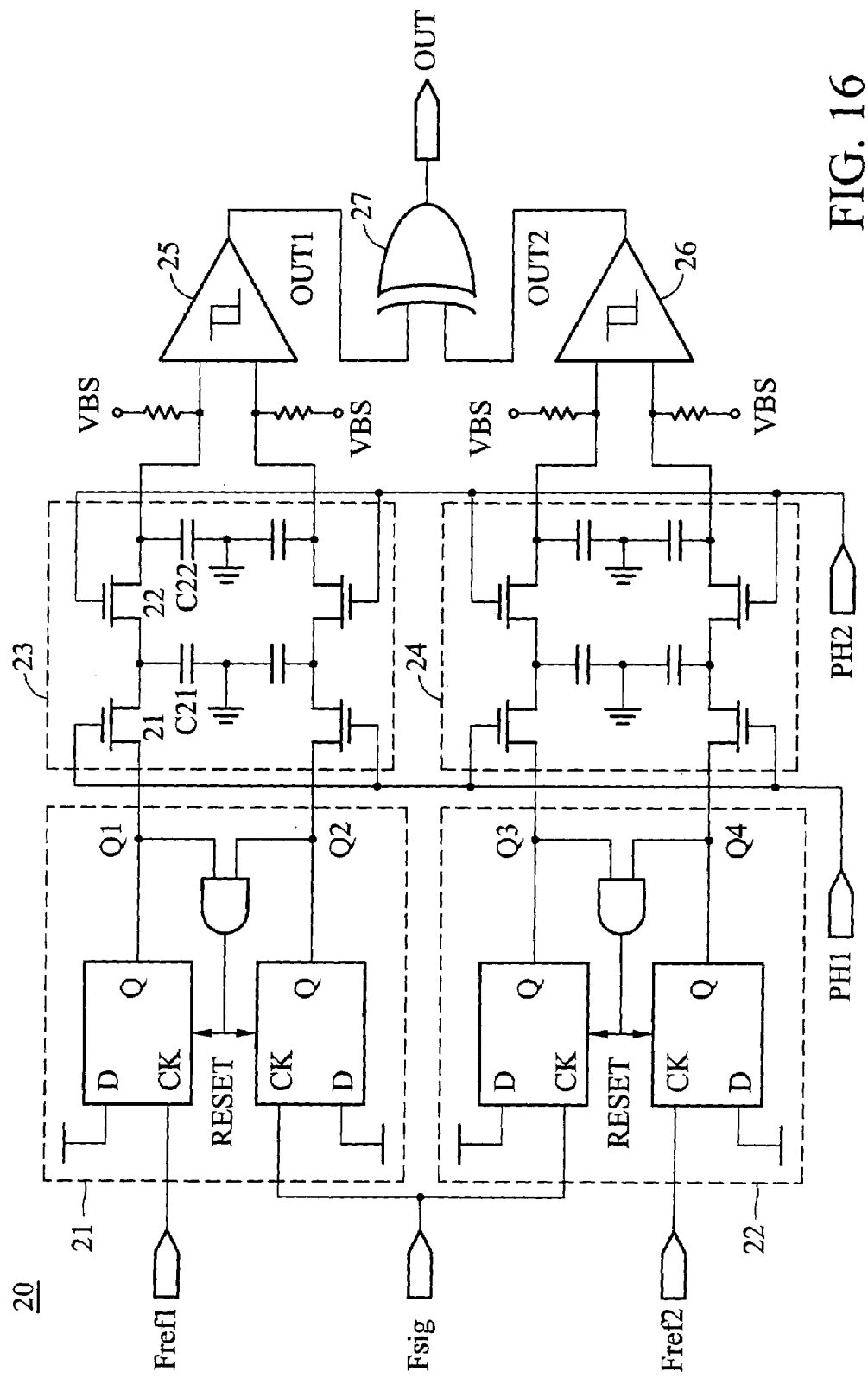
FIG. 16 is a schematic diagram illustrating the circuit of the frequency detector 20.

FIG. 16 is a schematic diagram illustrating the circuit of the frequency detector 20. The frequency detector 20 comprises phase-frequency detectors 21 and 22, low-pass filters 23 and 24, comparators 25 and 26, and an exclusive gate 27. The frequency detector 20 receives three input signals, a first reference signal having the first reference frequency Fref1, a second reference signal having the second reference frequency Fref2, and the test signal. The test signal is the oscillation signal of the voltage control oscillator, and it has the frequency Fsig. The low-pass filters 23 and 24 are used to detect the dc components of the output signals of the phase-frequency detectors 21 and 22 respectively. By this method, relationships between the frequency of the test signal, the first reference frequency, and the second reference frequency can be decided. The phase-frequency detector 21 comprises a D-type flip-flop DFF1, a D-type flip-flop DFF2, and an AND-gate AND1.

Figure 17:
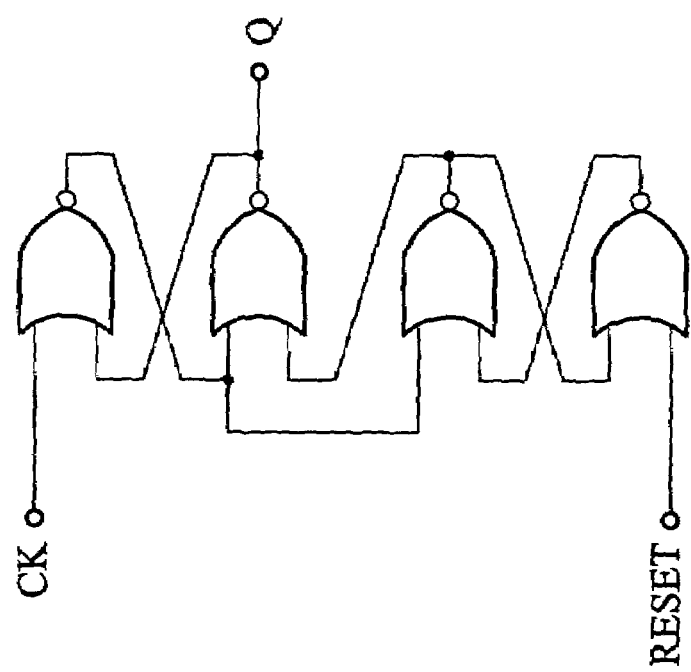
FIG. 17 is a schematic diagram illustrating the circuit of the D-type flip-flop (DFF)

FIG. 17 is a schematic diagram illustrating the circuit of the D-type flip-flop (DFF). When the frequency Fref1 is higher than the frequency Fsig, Q1 will have the main dc component; on the contrary, when the frequency Fref1 is lower than the frequency Fsig, Q2 will have the main dc component. Similarly, when the frequency Fref2 is higher than the frequency Fsig, Q4 will have the main dc component; on the contrary, when the frequency Fref2 is lower than the frequency Fsig, Q3 will have the main dc component.

Figure 18A:
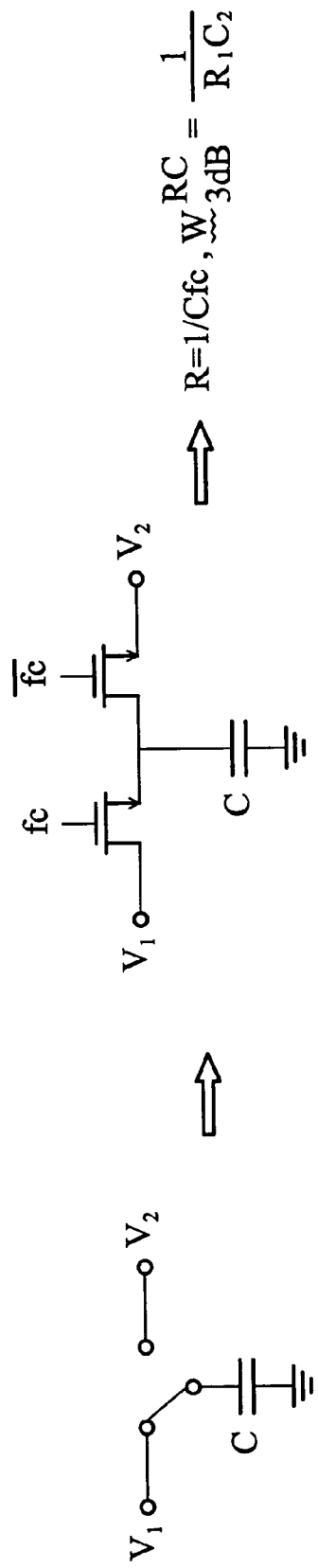
FIG. 18A is a schematic diagram illustrating the switch capacitance circuit of resistors.
Figure 18B:
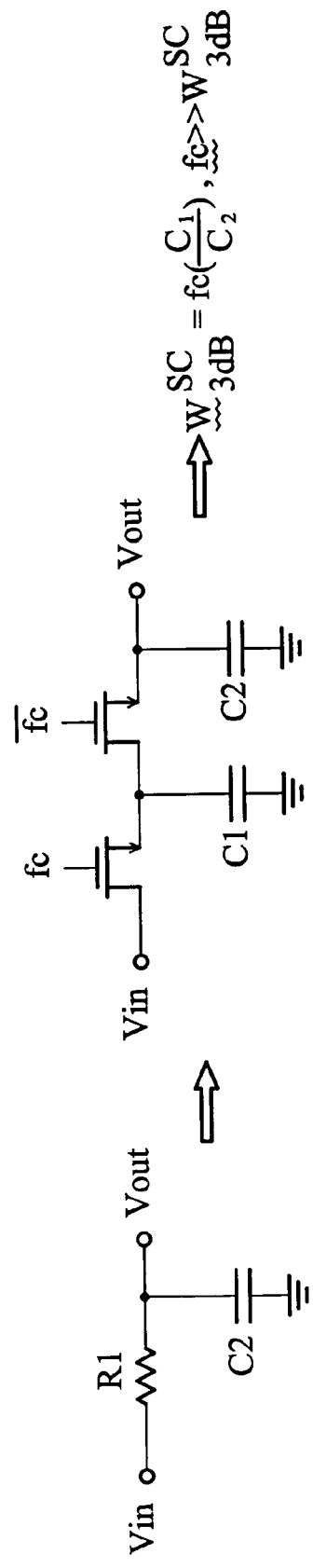
FIG. 18B is a schematic diagram illustrating the switch capacitance circuit of low-pass filters.

FIG. 18A is a schematic diagram illustrating the switch capacitance circuit of resistors. FIG. 18B is a schematic diagram illustrating the switch capacitance circuit of low-pass filters. By controlling the clock signals PH1 and PH2 in FIG. 16, the capacitors C21, C22 and the transistors M21, M22 constitute the switch capacitance low-pass filter 21 wherein the capacitor C21, the transistor M21, and the transistor M22 constitute an effective resistor. The effective resistance R=1/(C21fc). The 3 dB bandwidth of the low-pass filter w3 dB=1/RC22=f(C21/C22). When operating the frequency detector 20, the frequencies fc of the clock signals PH1 and PH2 should satisfy the following condition: fc>>w3 dB. The low-pass filter 23 integrates the detection signals Q1 and Q2 and outputs a dc voltage level. The comparator 25 receives the dc voltage level and outputs a comparison signal having a logic level. The logic level represents the magnitude relationship of the oscillation frequency Fsig and the reference frequency Fref1.

Figure 19:
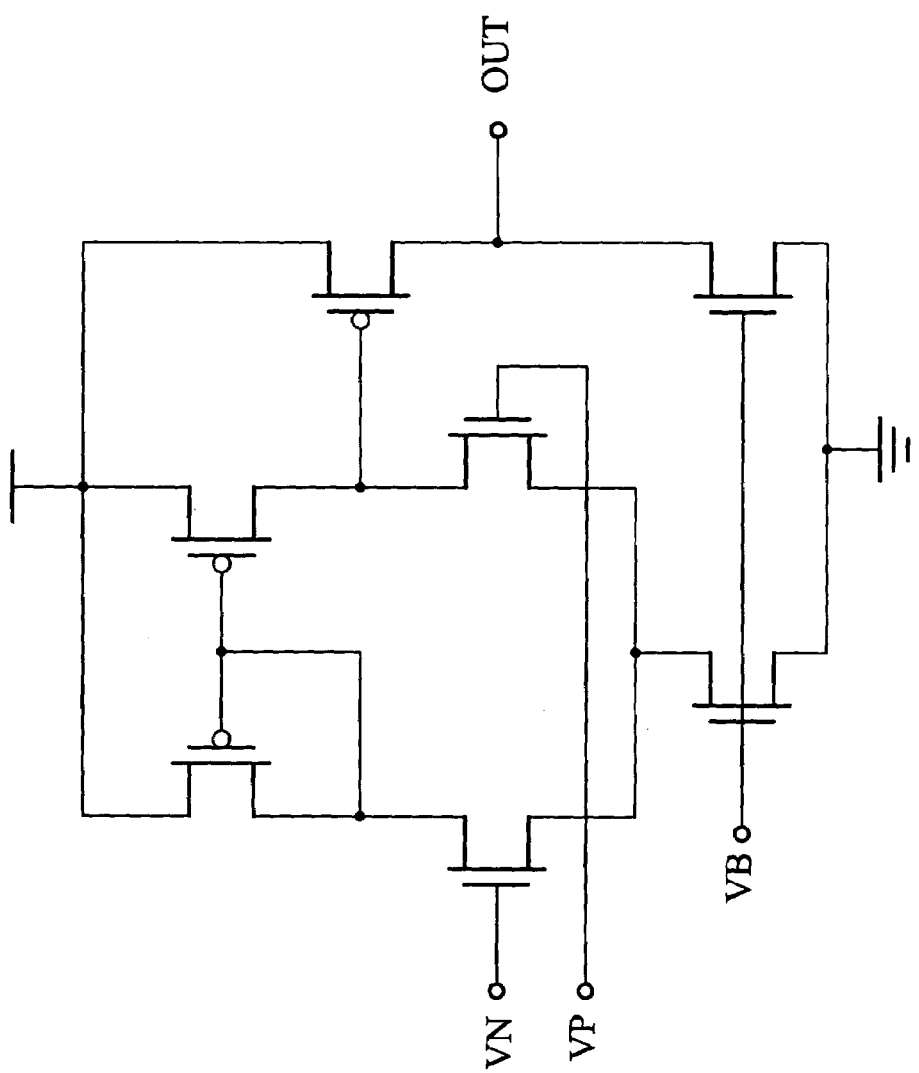
FIG. 19 is a schematic diagram illustrating the circuit of the comparator.

FIG. 19 is a schematic diagram illustrating the circuit of the comparator. The phase-frequency detector 22, the low-pass filter 24, and the comparator 26 generate the comparison signal of the reference frequency Fref2 and the oscillation frequency Fsig. The comparison signals of the comparators 25 and 26 are input into the exclusive gate 27. When the oscillation frequency Fsig lies between the reference frequency Fref1 and the reference frequency Fref2, the exclusive gate 27 will output 1, such that the oscillation frequency Fsig meets the requirement. Otherwise, the exclusive gate 27 will output 0, wherein the oscillation frequency Fsig does not meet the requirement.

Figure 20A:
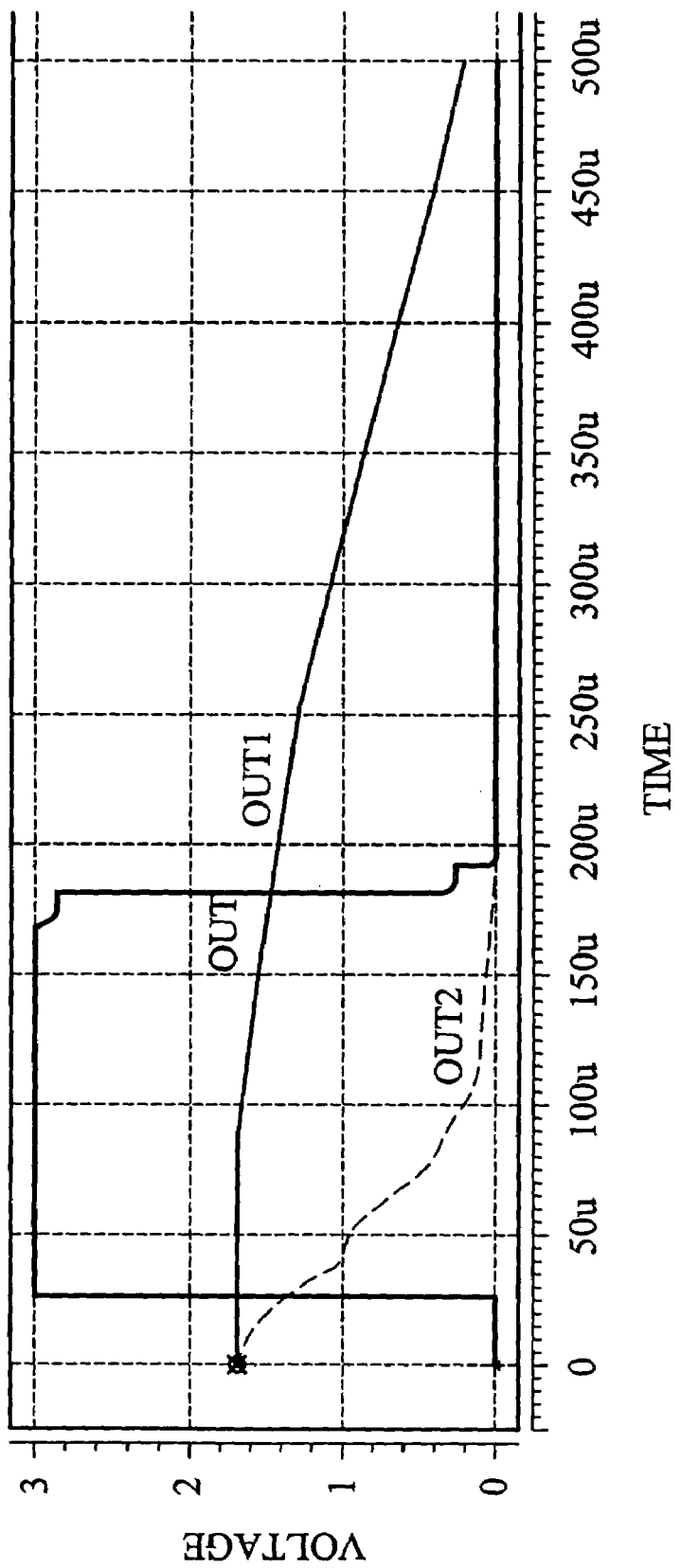
FIGS. 20A–20C are graphs illustrating the voltage-to-time wave of the frequency detector 20.
Figure 20B:
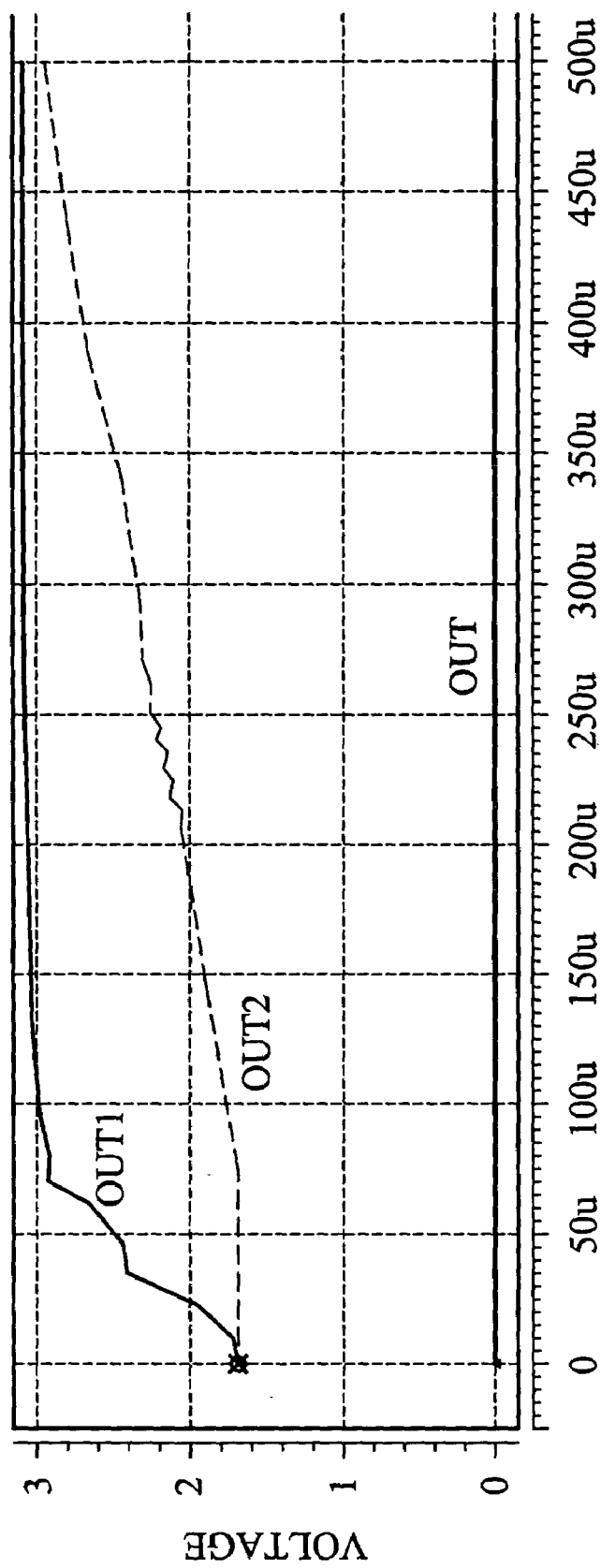
Figure 20C:
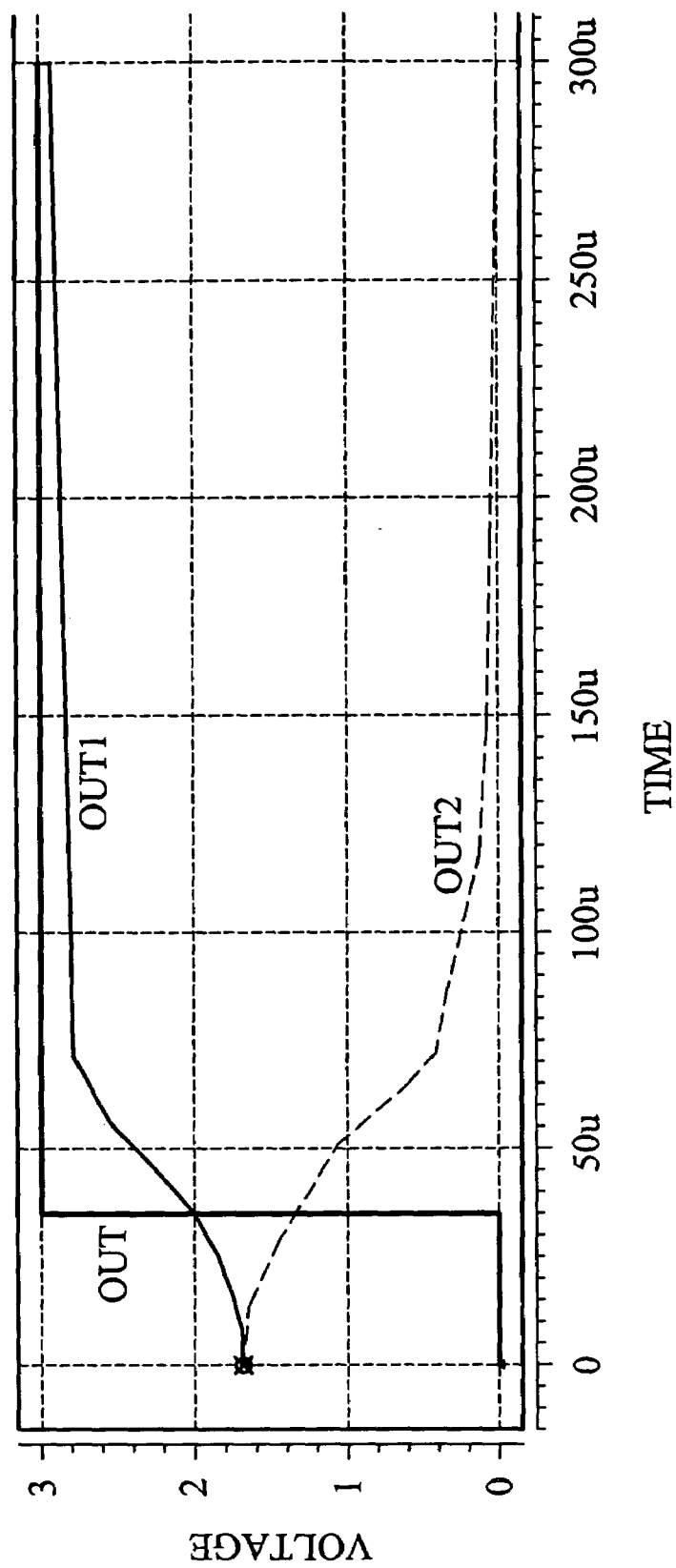

FIGS. 20A–20C are graphs illustrating the voltage-to-time wave of the frequency detector 20. As shown in FIG. 20A, when the oscillation frequency Fsig is lower than both the reference frequencies Fref1 and Fref2, the output end OUT1 of the comparator 25 is low-level, the output end OUT2 of the comparator 26 is low-level, and the output end OUT of the exclusive gate 27 is low-level. As shown in FIG. 20B, when the oscillation frequency Fsig is higher than both the reference frequencies Fref1 and Fref2, the output end OUT1 of the comparator 25 is high-level, the output end OUT2 of the comparator 26 is high-level, and the output end OUT of the exclusive gate 27 is low-level. As shown in FIG. 20C, when the oscillation frequency Fsig lies between the reference frequencies Fref1 and Fref2, the output end OUT1 of the comparator 25 is high-level, the output end OUT2 of the comparator 26 is low-level, and the output end OUT of the exclusive gate 27 is high-level.

Figure 21:
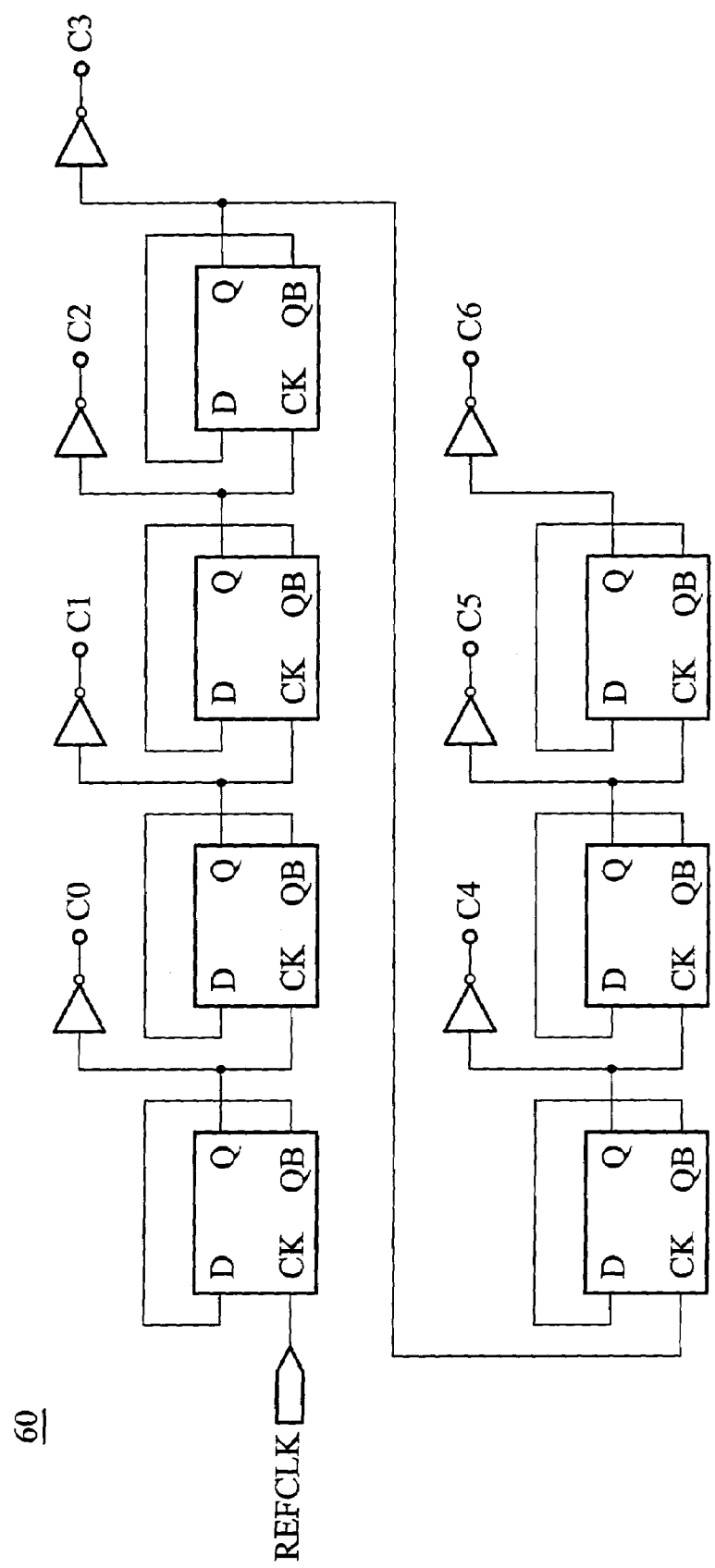
FIG. 21 is a schematic diagram illustrating the circuit of the programmable counter 60.

FIG. 21 is a schematic diagram illustrating the circuit of the programmable counter 60. The programmable counter comprises an asynchronous counter having positive edge trigger D-type flip-flops (DFF). The QB of each flip-flop is looped to D of each flip-flop. The Q of each flip-flop is input into CK of the flip-flop at the next stage. The reference operating frequency REFCLK should be lower than the output frequency of the voltage control oscillator 10, so that the self-test system will have enough time to finish the whole operation before the next digital code is generated.

Figure 22:
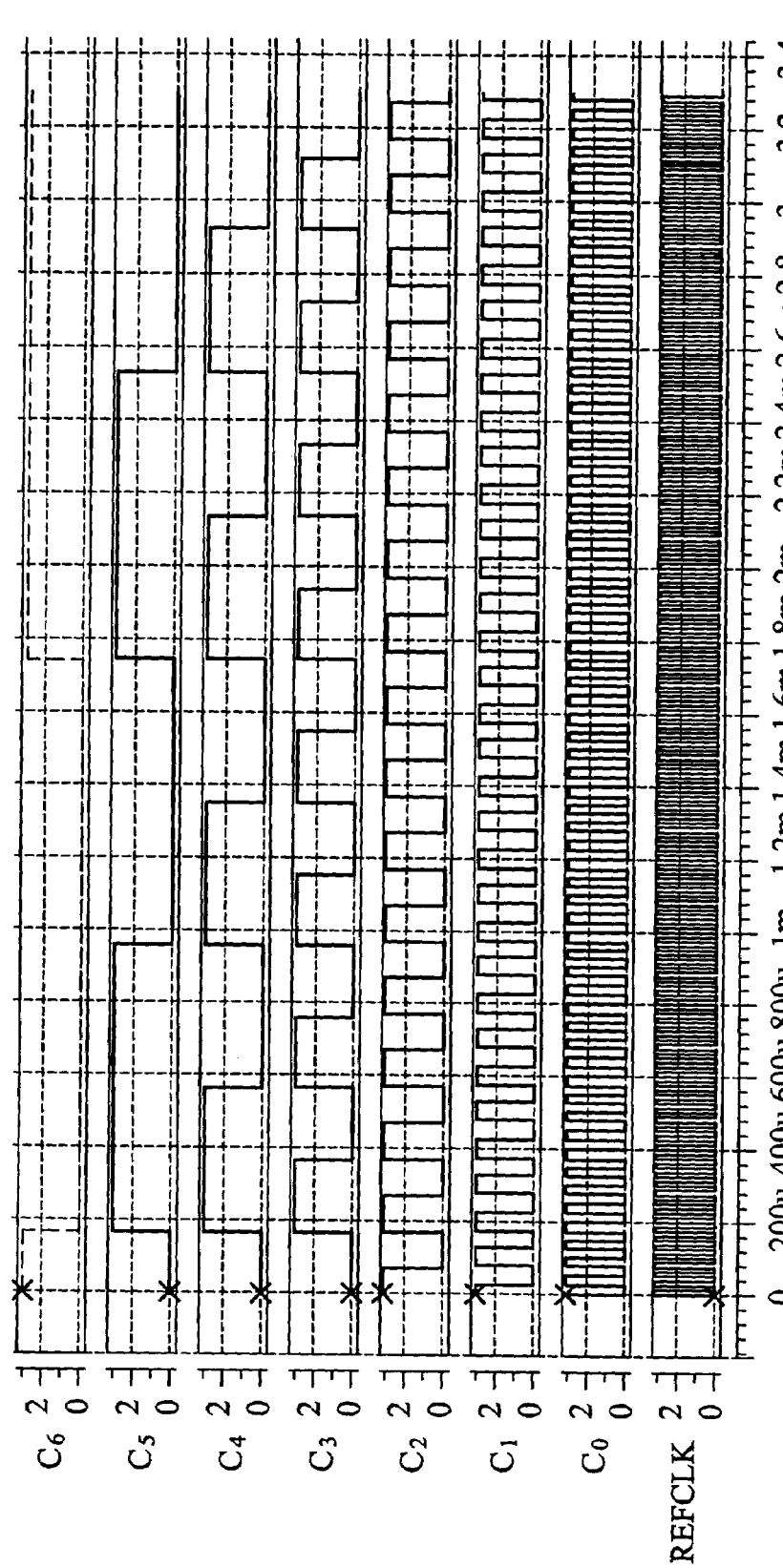
FIG. 22 is a graph illustrating the wave of the programmable counter 60.

FIG. 22 is a graph illustrating the wave of the programmable counter 60. The outputs C0–C6 of the programmable counter 60 are used to change the digital codes of the digital tuning circuit 80 and sweep the frequency of the digital adjustable chip oscillator 12. The main object of the programmable controller 40 is to control the writing operation. The frequency detector 20 detects the frequency of the digital adjustable chip oscillator 12. When the frequency of the digital adjustable chip oscillator 12 lies between the two reference frequencies, the programmable controller 40 will send a stop signal to the programmable counter 60. Therefore, the programmable counter 60 will stop the operation, the output of the programmable counter 60 will be fixed at a digital code, and the programmable gate writer 50 and the programmable fuse 55 will be allowed to perform the writing operation. At the same time, the programmable controller 40 will send a reset signal notifying the controller to recount.

Figure 23:
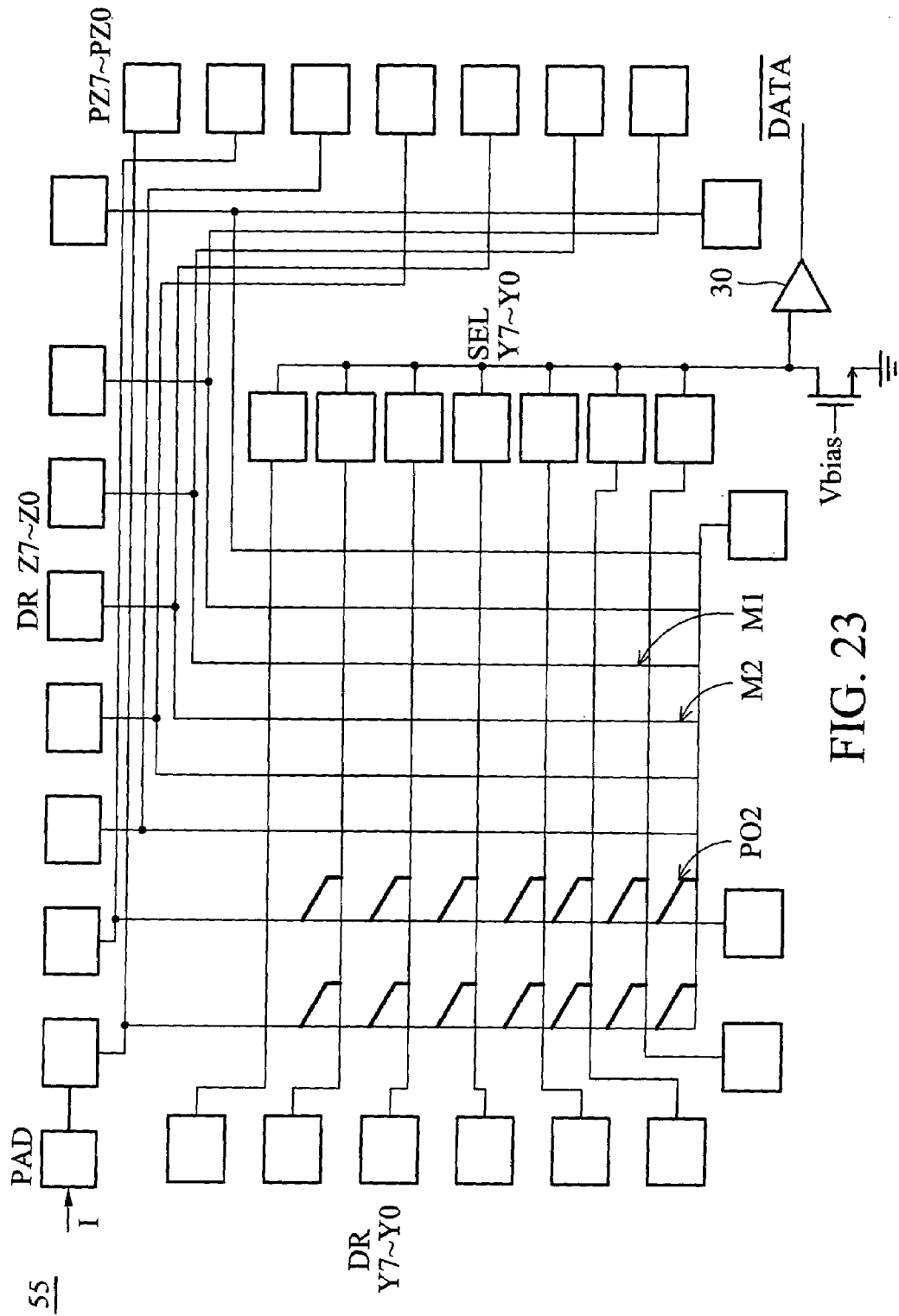
FIG. 23 is a schematic diagram illustrating the programmable fuse 55.

FIG. 23 is a schematic diagram illustrating the programmable fuse 55. As shown in FIG. 23, the programmable fuse 55 comprises a plurality of decoders (DR) and a plurality of poly-silicon fuses (PO2).

Figure 24:
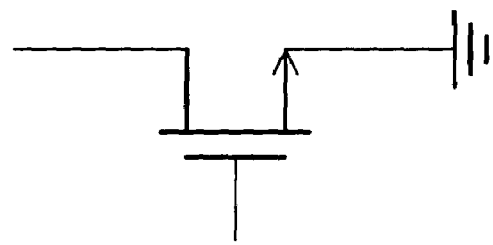
FIG. 24 is a structural diagram illustrating the poly-silicon fuse (PO2)
Figure 24:
Figure 24:
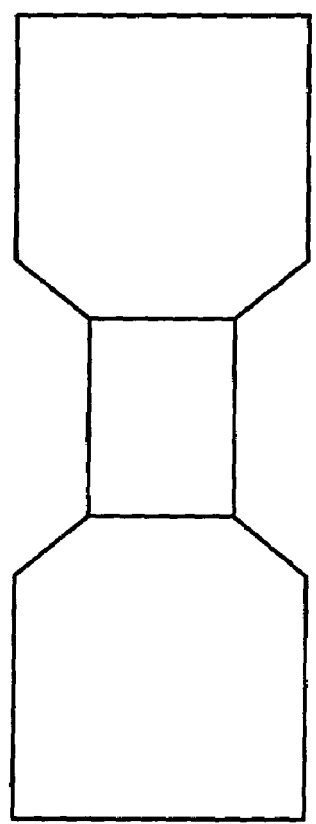

FIG. 24 is a structural diagram illustrating the poly-silicon fuse (PO2). The fuse PO2 uses a layer of poly-silicon or a layer of metal. The layers are 1 to 5 times the size of the unit square of material used. If 5 to 15 volts of the conductance dc voltage are input into the poly-silicon fuse, the poly-silicon fuse will burn out. By this characteristic, the poly-silicon fuse achieves the writing operation. As well as the poly-silicon fuse, the programmable gate writer 50 can also perform the writing operation. Compared with the poly-silicon fuse, the programmable gate writer 50 works like an electrical erasable programmable read-only memory (EEPROM).

Figure 25:
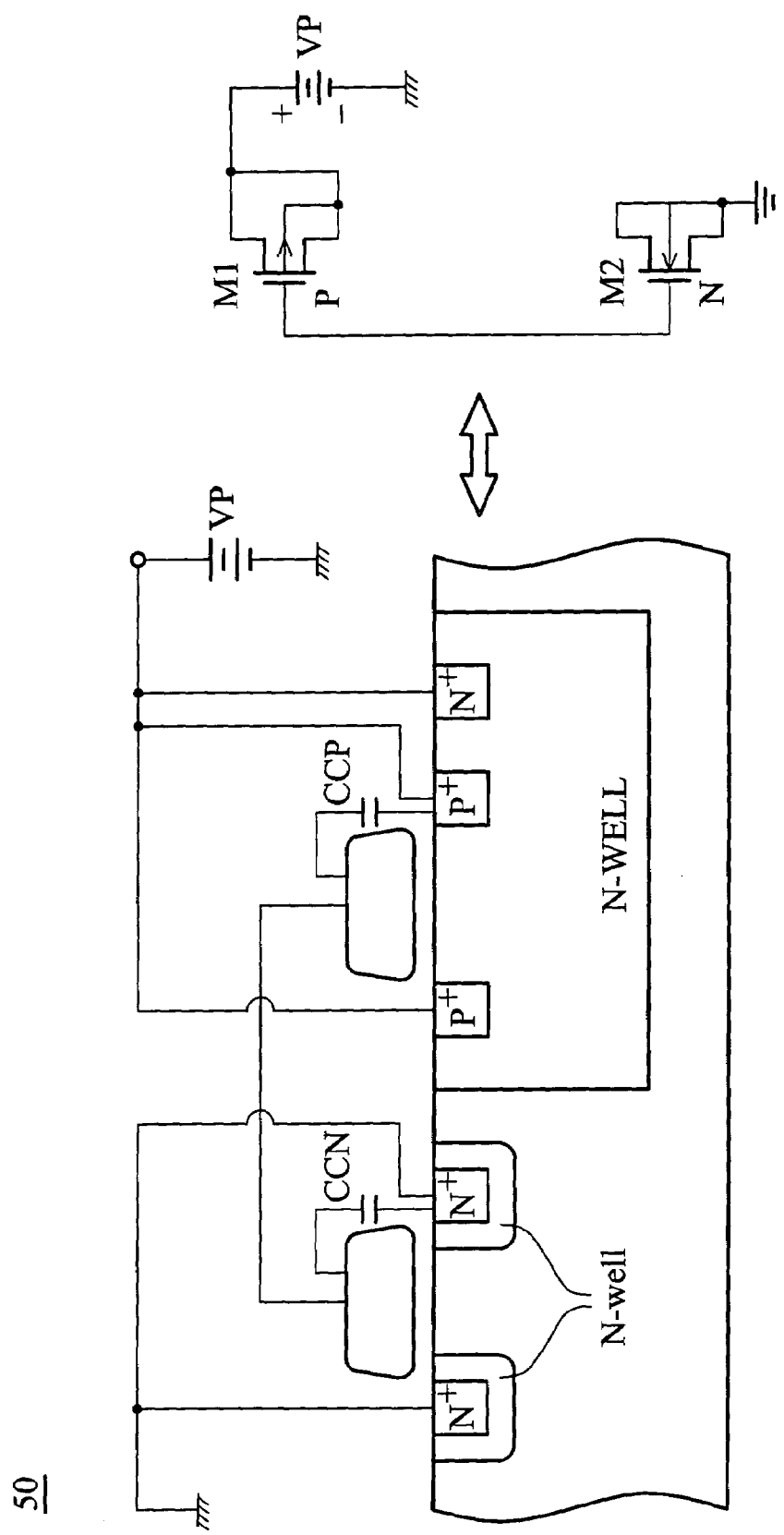
FIGS. 25–29 are structural diagrams illustrating the programmable gate writer 50.
Figure 26:
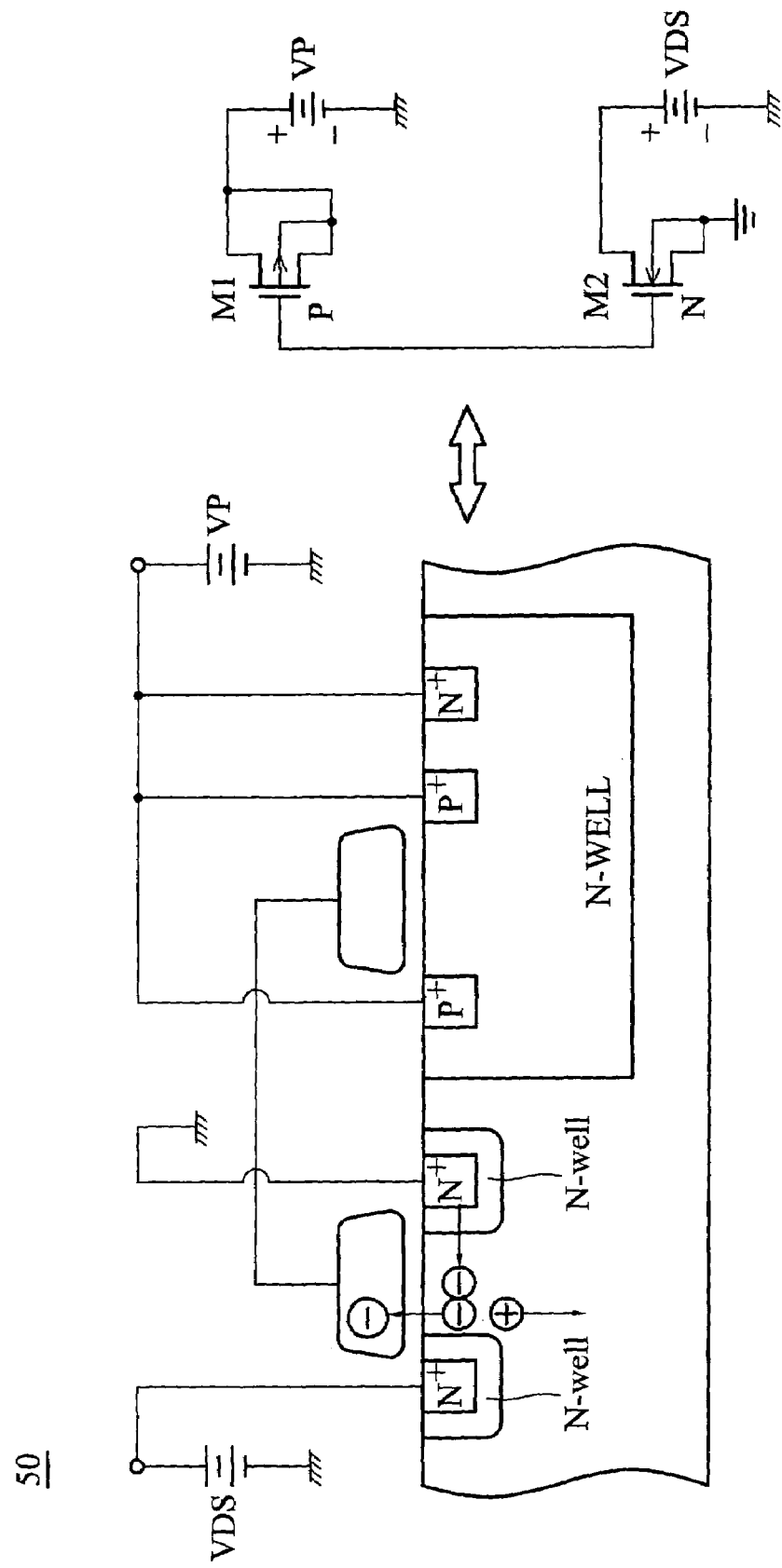
Figure 27:
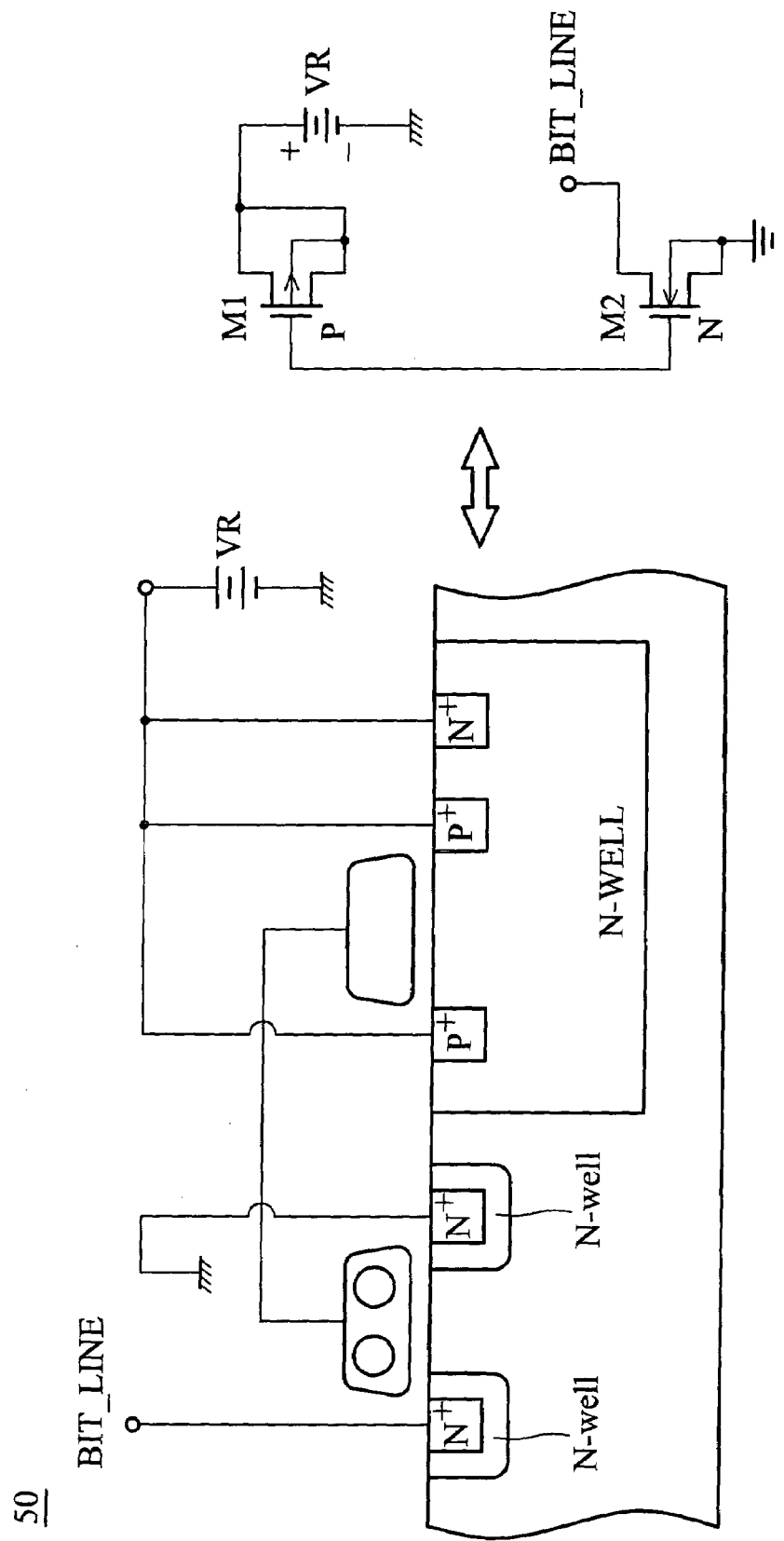
Figure 28:
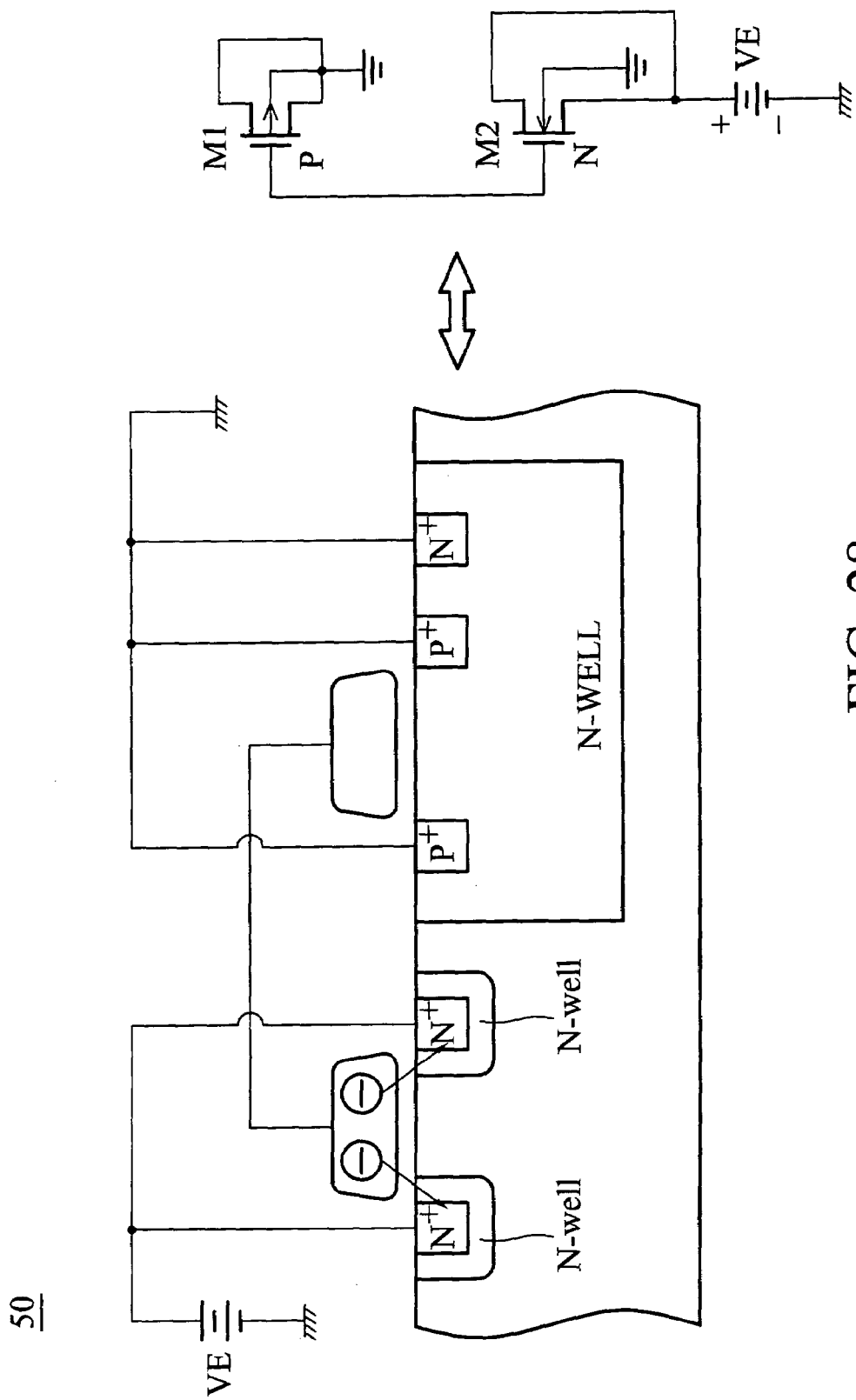
Figure 29:
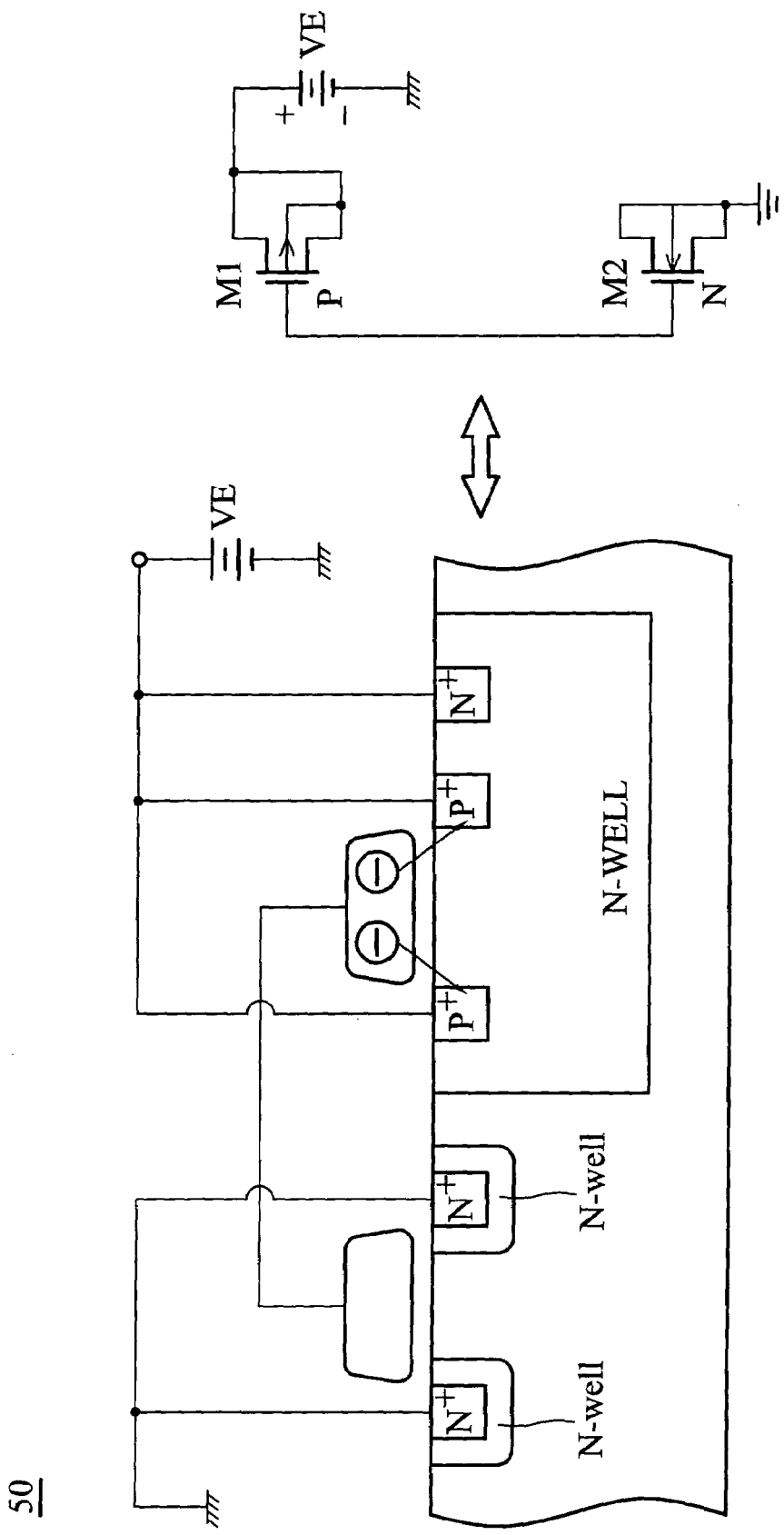

FIGS. 25–29 are structural diagrams illustrating the circuit of the programmable gate writer 50. The programmable gate writer 50 can be manufactured using the standard CMOS manufacturing process. FIG. 25 shows the F/N tunneling floating gate transistor. The gate of the PMOS transistor M1 and the gate of the NMOS transistor M2 are coupled together to form a floating gate. The drain and the source of the PMOS transistor M1 are coupled together to form a capacitor. The drain and the source of the NMOS transistor M2 are coupled together to form a capacitor. To satisfy the conditions of Fowler-Nordheim tunneling, the ratio of the gate capacitance CGP of the PMOS transistor M1 to the gate capacitance CGN of the NMOS transistor M2 should be larger than 3. FIG. 26 shows the hot electron floating gate transistor. To satisfy the conditions of hot electrons in the NMOS tunnel, the ratio of the gate capacitance CGP of the PMOS transistor M1 to the gate capacitance CGN of the NMOS transistor M2 should be smaller than 3. FIG. 27 shows the floating gate transistor performing access. FIG. 28 shows the F/N tunneling floating gate transistor performing deletion. FIG. 29 shows the hot electron floating gate transistor performing deletion. Additionally, the advantages of the standard CMOS manufacturing process are as follows: (1) the circuit area can be decreased; (2) the power consumption of the circuit can be decreased; (3) the record of the writing operation can be read; (4) the record of the writing operation can be written; (5) the record of the writing operation can be deleted; and (6) the circuit can be integrated into other commonly used digital CMOS circuits.

The Second Embodiment

Figure 30:
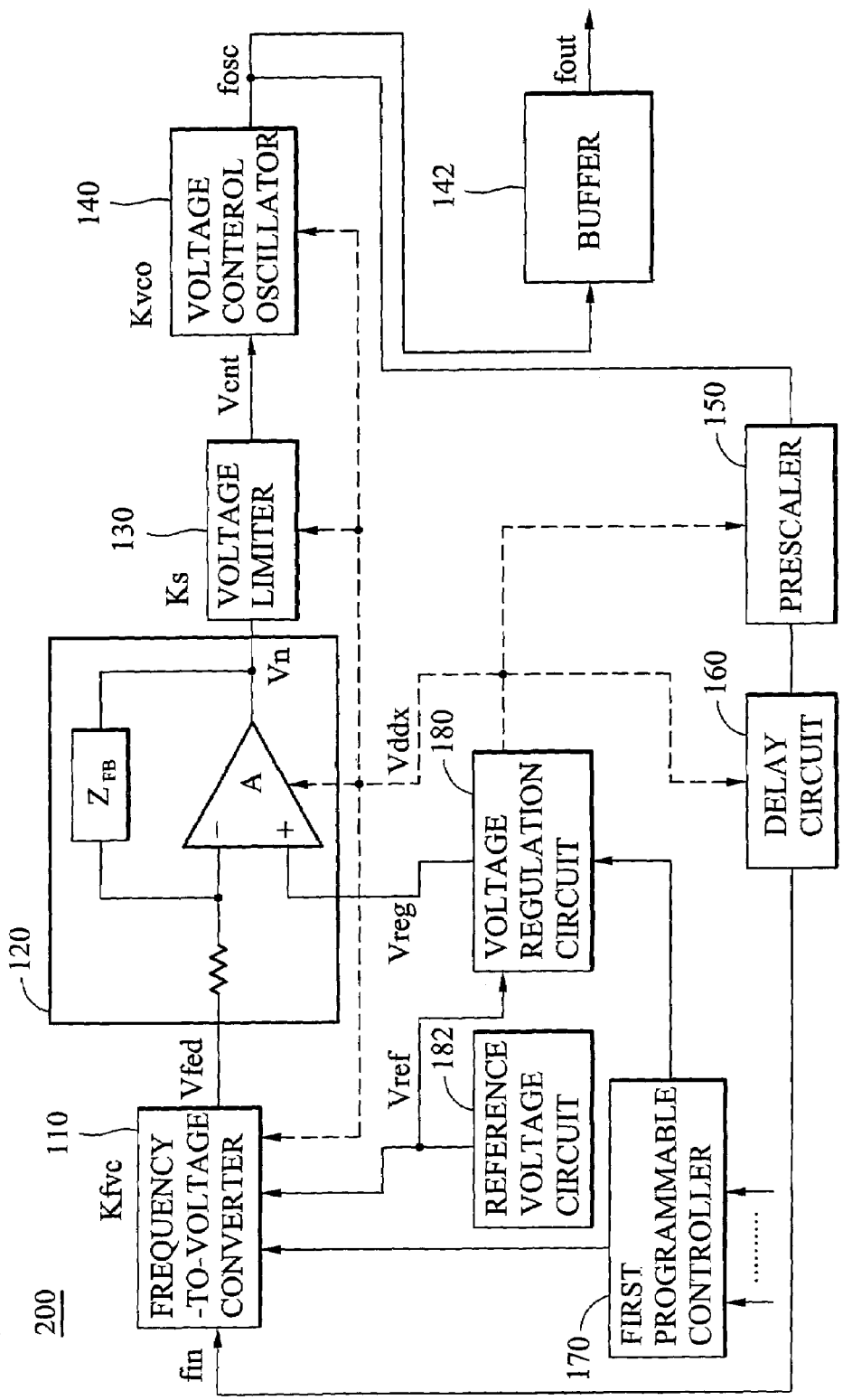
FIG. 30 is a block diagram illustrating the chip oscillator with loop circuits 200 in the second embodiment.

FIG. 30 is a block diagram illustrating the chip oscillator with loop circuits 200 in the second embodiment. The chip oscillator with loop circuits 200 has a loop control circuit comprising a frequency-to-voltage converter 110, an active comparison filter 120, a voltage limiter 130, a voltage control oscillator 140, a buffer 142, a prescaler 150, a delay circuit 160, a first programmable controller 170, a second programmable controller 170, a voltage regulation circuit 180, and a reference voltage circuit 182. The frequency-to-voltage converter 110 converts the frequency of the oscillation signal of the voltage control oscillator 140 to a loop voltage Vfed. Using the negative loop circuit, the loop voltage Vfed follows the reference voltage Vreg. Therefore the output frequency fout is controlled by the reference voltage. When the loop circuit is stable, the output frequency $$fout = N*Vreg/Kfvc \quad (1).$$

And the reference voltage Vref can be changed by the programmable tuning circuit 170. N is the prescaler parameter of the prescaler 150. Kfvc is the conversion gain of the frequency-to-voltage converter 110. The lock time of the chip oscillator with loop circuits herein is very short compared to the frequency synthesizer of the phase-lock loop circuit. The frequency synthesizer of the phase-lock loop circuit compares the output frequency of the loop circuit with the reference frequency and compares the output phase of the loop circuit with the reference phase.

Figure 31A:
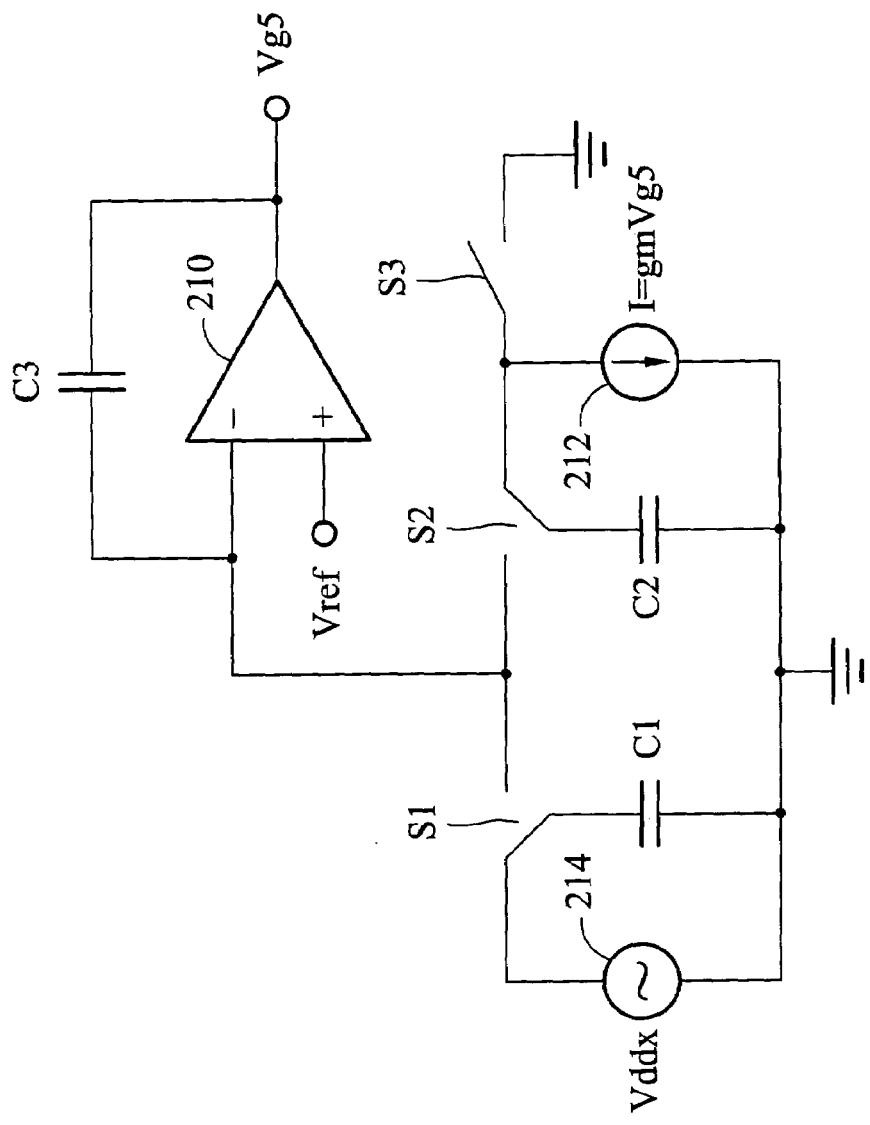
FIG. 31A is a schematic block diagram illustrating the frequency-to-voltage converter 110.
Figure 31B:
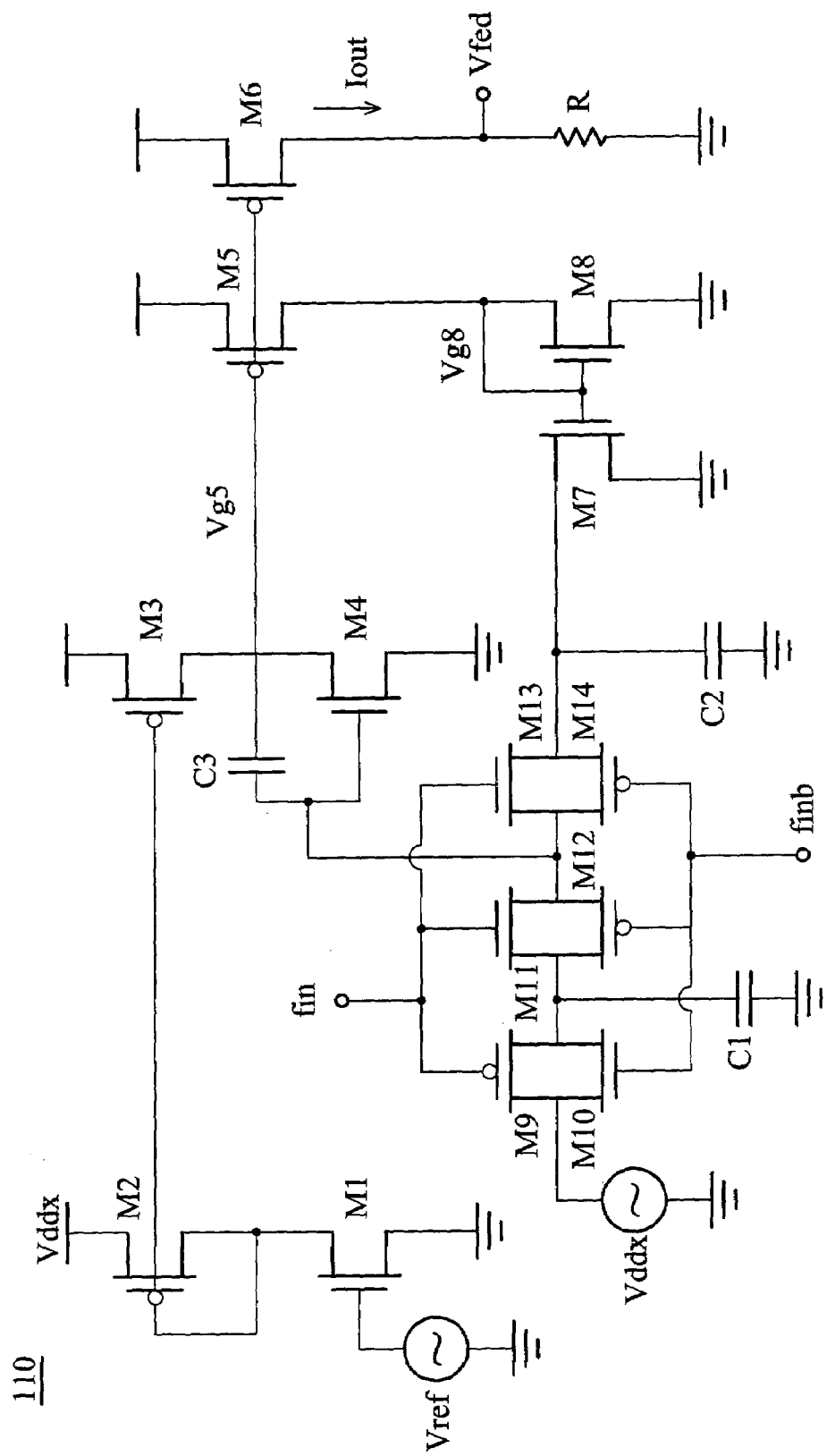
FIG. 31B is a schematic diagram illustrating the circuit of the frequency-to-voltage converter 110.

FIG. 31A is a schematic block diagram illustrating the frequency-to-voltage converter 110. FIG. 31B is a schematic diagram illustrating the circuit of the frequency-to-voltage converter 110. The frequency-to-voltage converter 110 comprises: capacitors C1, C2, and C3; a reversed-phase amplifier 210; switches S1, S2, and S3; a voltage source Vddx; and a voltage control current source 212. The frequency-to-voltage converter 110 is mainly adjusted by controlling the electric charge distribution of the switch capacitance and the frequency of the input signal of the switch.

Figure 32:
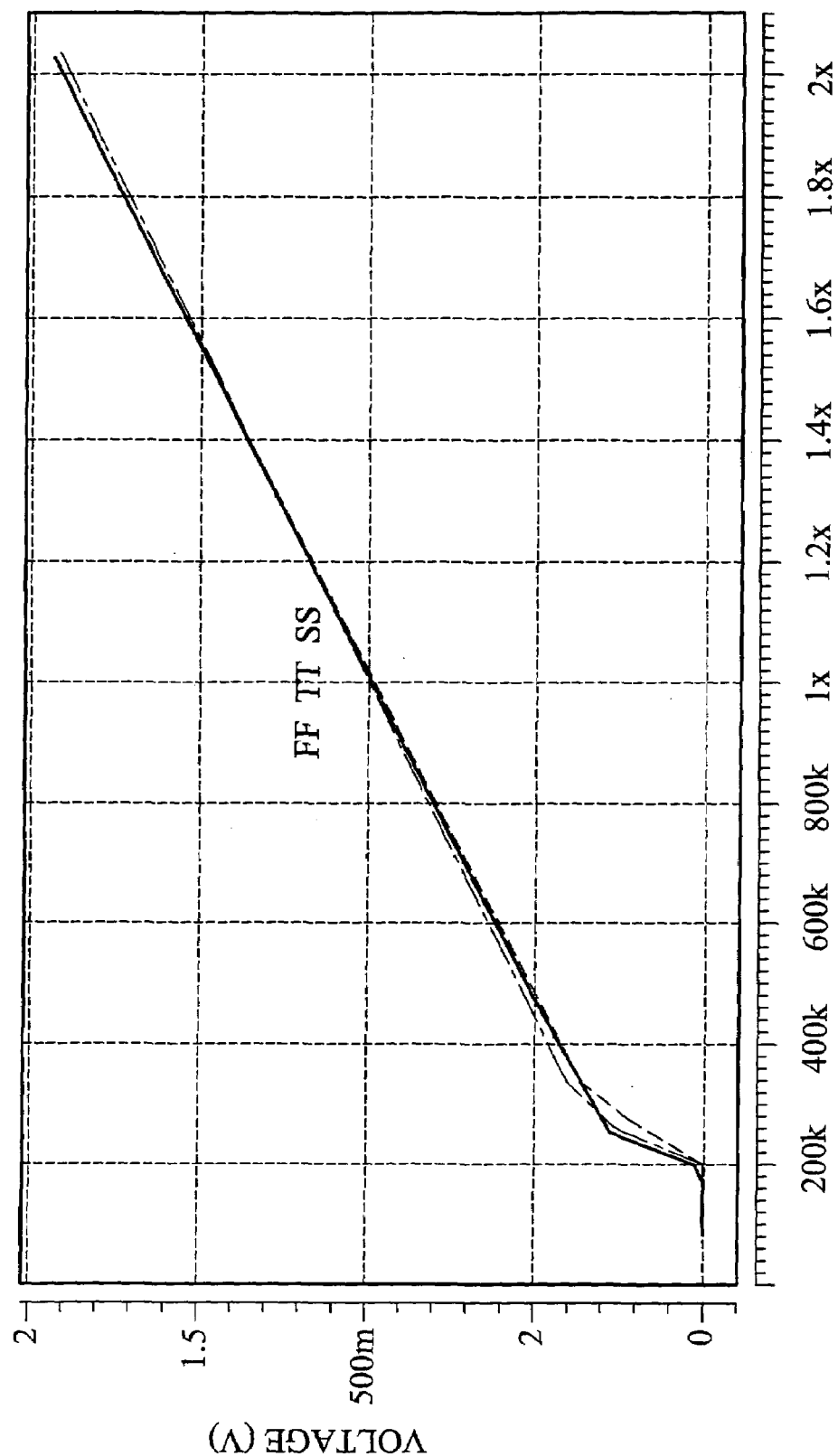
FIG. 32 is a graph illustrating the frequency-to-voltage wave of the frequency-to-voltage converter 110.

FIG. 32 is a graph illustrating the frequency-to-voltage wave of the frequency-to-voltage converter 110. The output voltage Vg5 of the integrator controls the discharge balance current gmvg. The transconductance gm is decided by the ratio of the transistor M5 to the current mirrors M7 and M8, which is K=(W/L)7/(W/L)8. In the temporal phase T1, the switch S1 turns on and the capacitor C1 charges to Vddx. In the temporal phase T2, the switches S2 and S3 turn on, the capacitors C1 and C2 couple with the virtual shortcut voltage Vref, and the loss electric charges of the capacitor C1 flow into the capacitors C2 and C3 wherein the loss electric charges Q=C1(Vddx−Vref). In stable state, the electric charges flowing into the capacitor C3 are 0, so the whole electric charges flow into the capacitor C2. Also, in stable state, the electric charges in the capacitor C2 are electrically balanced. From Q=I7*T1, $$I7=C1*(Vddx-Vref)/T1 \quad (2).$$

The output voltage Vout is directly proportional to the output current Iout, and the output current Iout is directly proportional to the currents of the transistors M5 and M7. Therefore, $$Vout=K*R*C1(Vref-Vg)f1 \quad (3).$$

$$F1=1/T1$$

To be operated under a low voltage, the transmission gates of the transistors M9 to M10, M11 to M12, and M13 to 14 are used as switches to lower the impedance and increase the conductance voltage range. To be fully charged and discharged, the input signals of the frequency-to-voltage converter 110 should satisfy the condition that the period of the temporal phase T1 is much larger than the period of the temporal phase T2.

Figure 33:
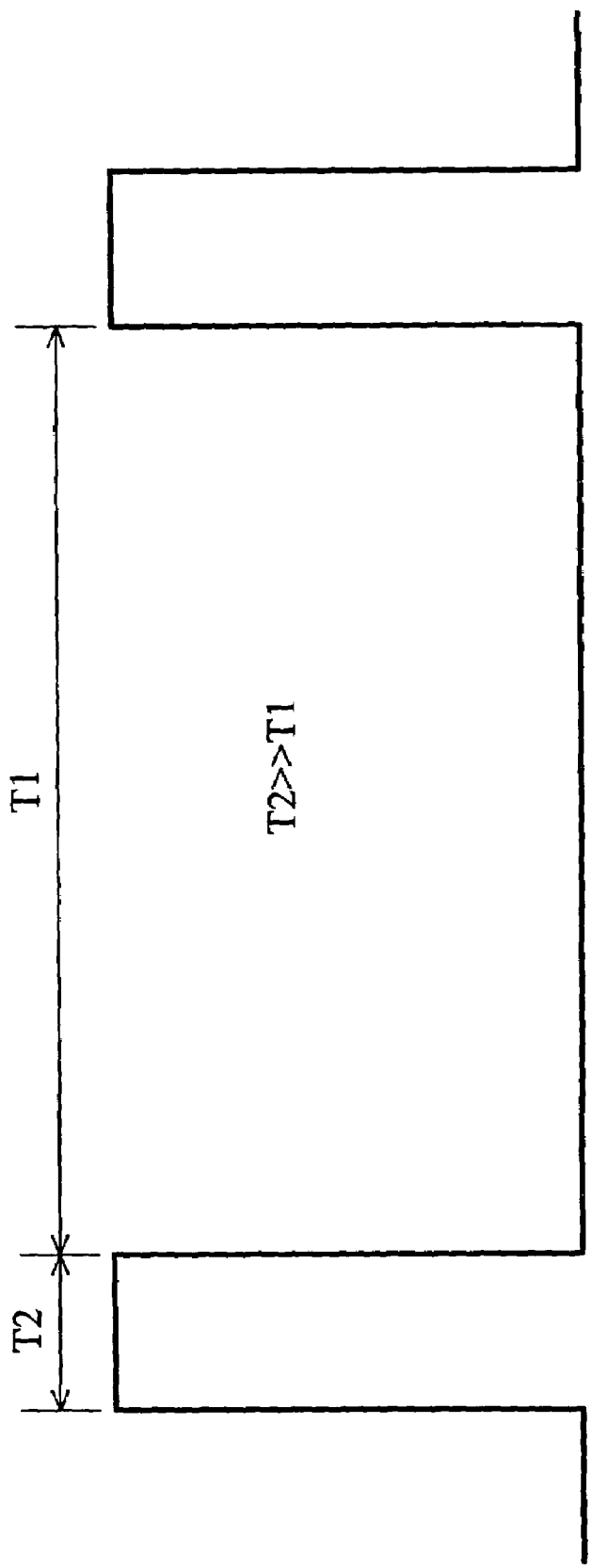
FIG. 33 is a graph illustrating the wave of the delay circuit 160.

FIG. 33 is a graph illustrating the wave of the delay circuit 160. The delay circuit 160 performs the conversion of the operating period of the oscillation signal.

Figure 34:
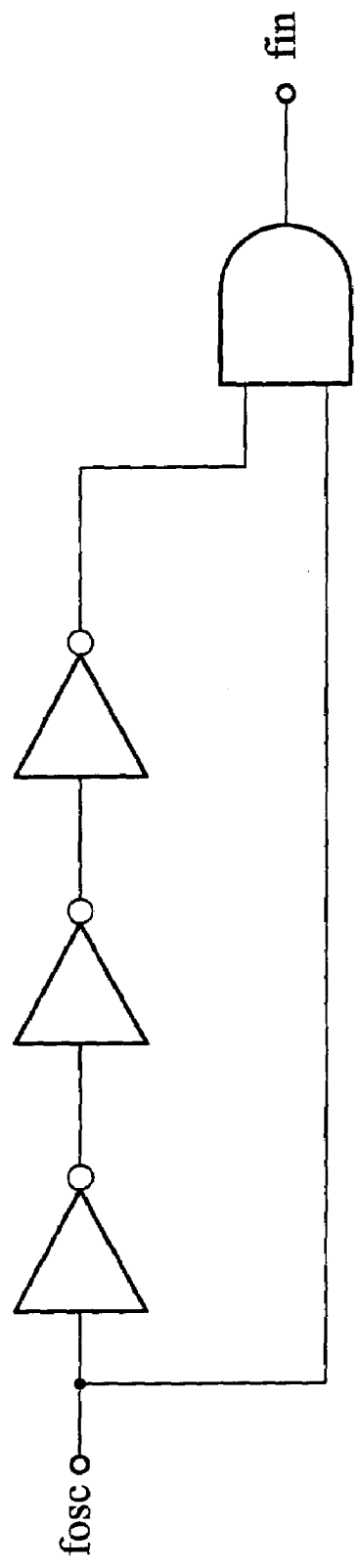
FIG. 34 is a schematic diagram illustrating the delay circuit 160.

FIG. 34 is a schematic diagram illustrating the delay circuit 160. From the above equation (3), the output voltage is directly proportional to the operating frequency. The operating voltage Vddx and the virtual shortcut voltage Vref are both fixed voltage without effects of the operating voltage and the manufacturing process. Therefore, the conversion characteristic of the frequency-to-voltage converter 110 is nearly linear.

Figure 35:
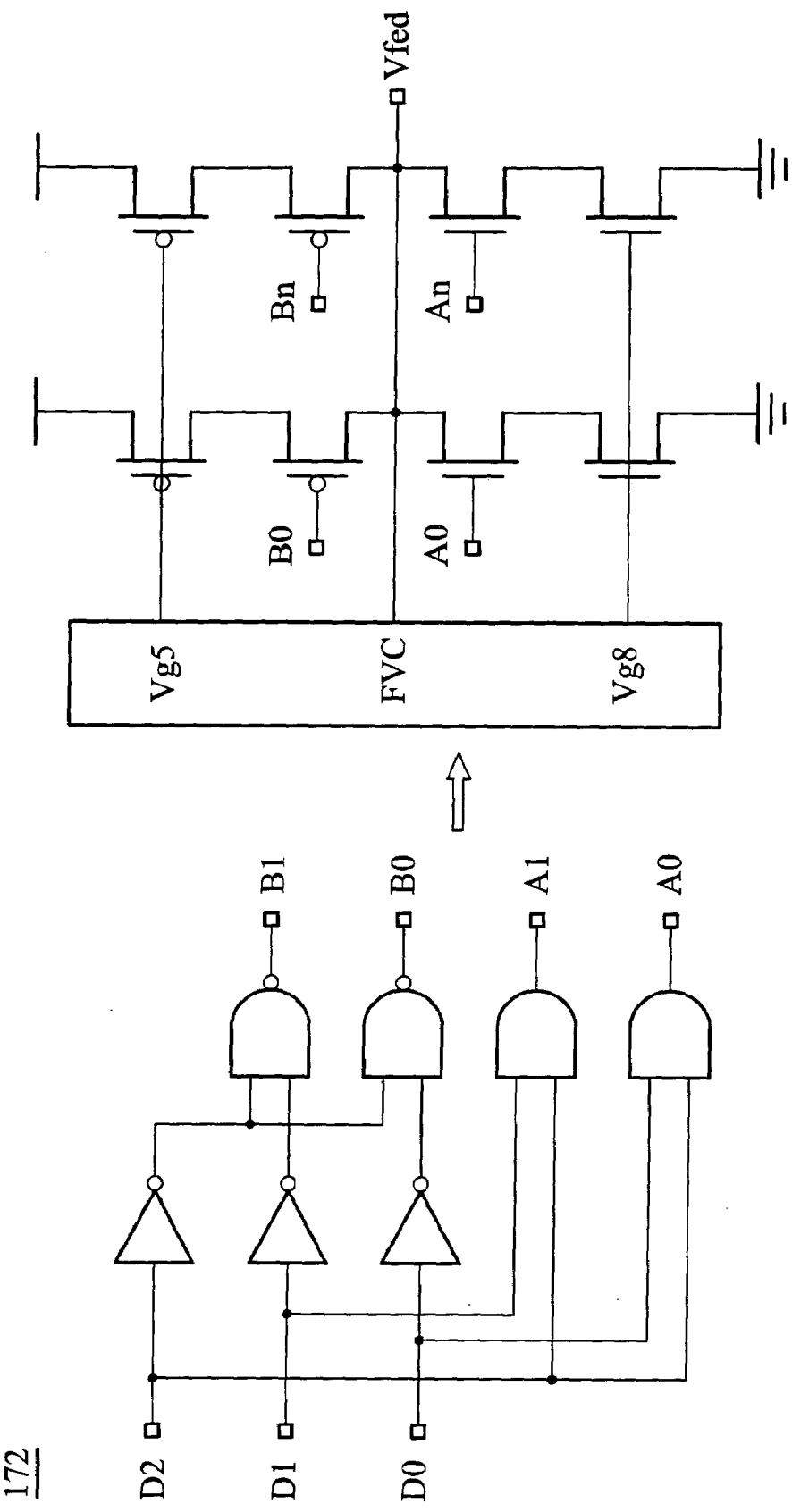
FIG. 35 is a schematic diagram illustrating the circuit of the second programmable controller 172.

FIG. 35 is a schematic diagram illustrating the circuit of the second programmable controller 172. The second programmable controller 172 comprises a plurality of current mirrors and a plurality of switches wherein the gates of the plurality of current mirrors are coupled to the gate of the transistor M5 or M8 of the frequency-to-voltage converter 110. Therefore, the current generated by each current mirror is a multiple of the balance current of the transistor M7 wherein the multiplication factor corresponds to the bit of the digital code. The plurality of switches coupled to the output ends of the correspondent plurality of current mirrors and the output ends of the frequency-to-voltage converter 110 receive the digital code to select the plurality of current mirrors, adjust K in the equation (3), and adjust Kfvc in the equation (1). The second programmable tuner 172 can be used as a fine-tuner in the digital adjustable chip oscillator.

Figure 36:
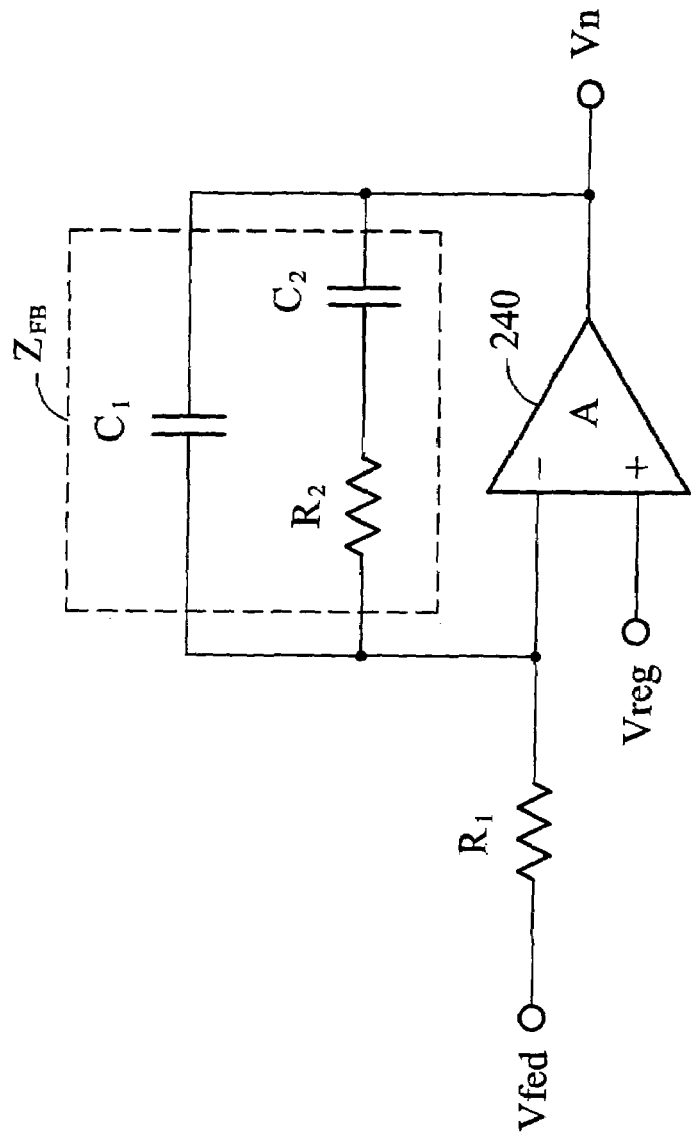
FIG. 36 is a schematic diagram illustrating the circuit of the active comparison filter 120.

FIG. 36 is a schematic diagram illustrating the circuit of the active comparison filter 120. The active comparison filter 120 comprises an operational amplifier 240, resistors R1 and R2, and capacitors C1 and C2. The active comparison filter 120 is a proportional integral filter used to compare the loop voltage Vfed of the frequency-to-voltage converter 110 with the reference voltage Vref and stabilize the loop circuit. The shift of the operational amplifier 240 can be compensated by the reference voltage adjusted by the programmable tuning circuit 170. The resistor R2, the capacitor C1, and the capacitor C2 constitute a filter used to filter the switch noise of the frequency-to-voltage converter 110, provide the voltage control oscillator 140 with a pure dc control voltage, and maintain the stability of the loop circuit. Using the active comparison filter 120, the tuning range of the input voltage of the voltage control oscillator 140 can be increased. The output of the active comparison filter 120 is an analog voltage signal, so there is a possibility that the output voltage is lower than the lowest control voltage of the voltage control oscillator 140. In such situation, the voltage control oscillator 140 will stop oscillating.

Figure 37:
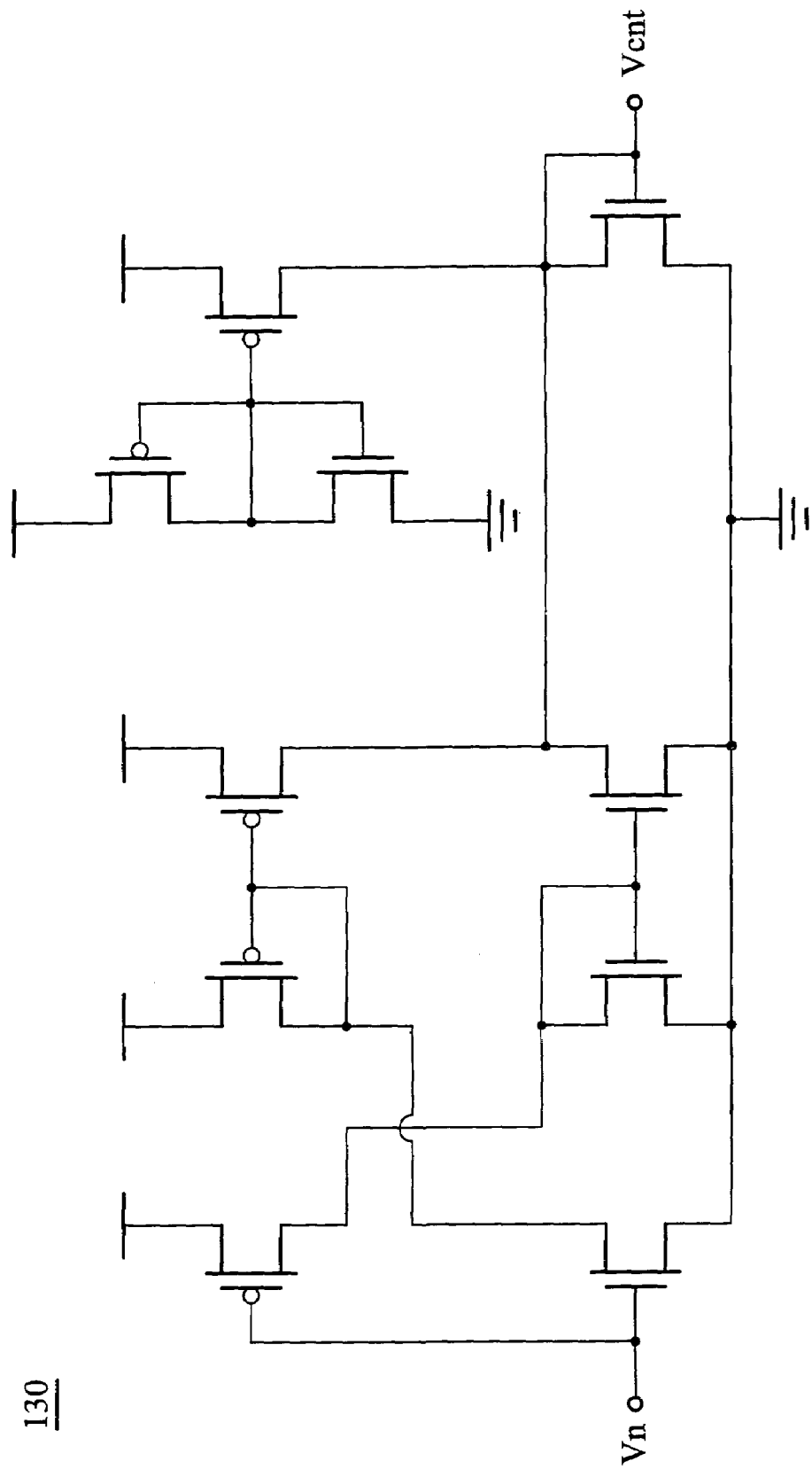
FIG. 37 is a schematic diagram illustrating the circuit of the voltage limiter 130.

FIG. 37 is a schematic diagram illustrating the circuit of the voltage limiter 130. The voltage limiter 130 converts the output low voltage or the output high voltage of the active comparison filter 120 to a voltage in the tuning range of the voltage control oscillator 140. For example, when the reference voltage Vref is higher than the loop voltage Vfed and the active comparison filter 120 outputs a low voltage, the voltage limiter 130 will convert the low voltage to the desired input voltage of the voltage control oscillator 140. Therefore, the voltage control oscillator 140 can adjust the input voltage and oscillate according to it. In this way, it is easier to have the desired high-precision output frequency.

Figure 38A:
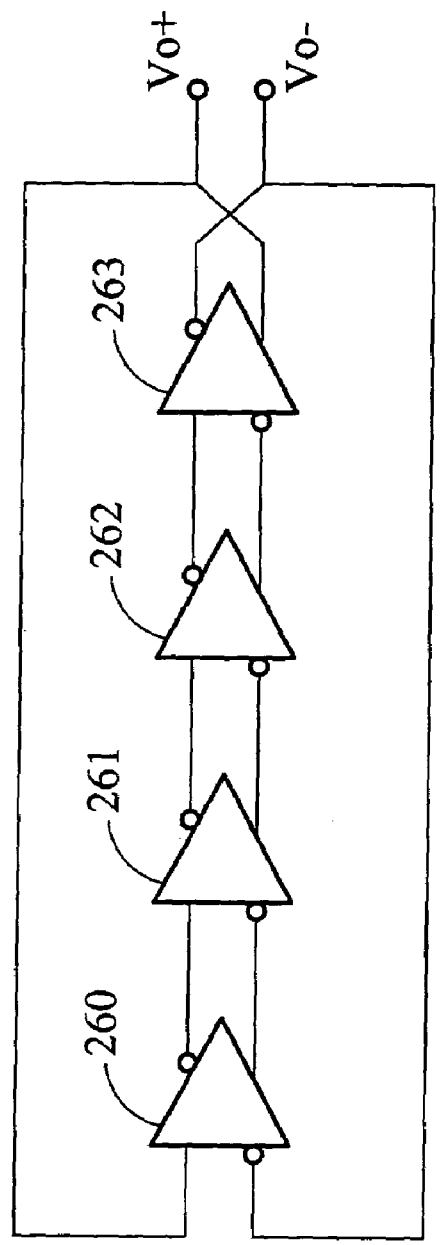
FIG. 38A is a schematic diagram illustrating the voltage control oscillator 140.

FIG. 38A is a schematic diagram illustrating the voltage control oscillator 140. The voltage control oscillator 140 comprises a ring oscillator having 4-stage differential delay units.

Figure 38B:
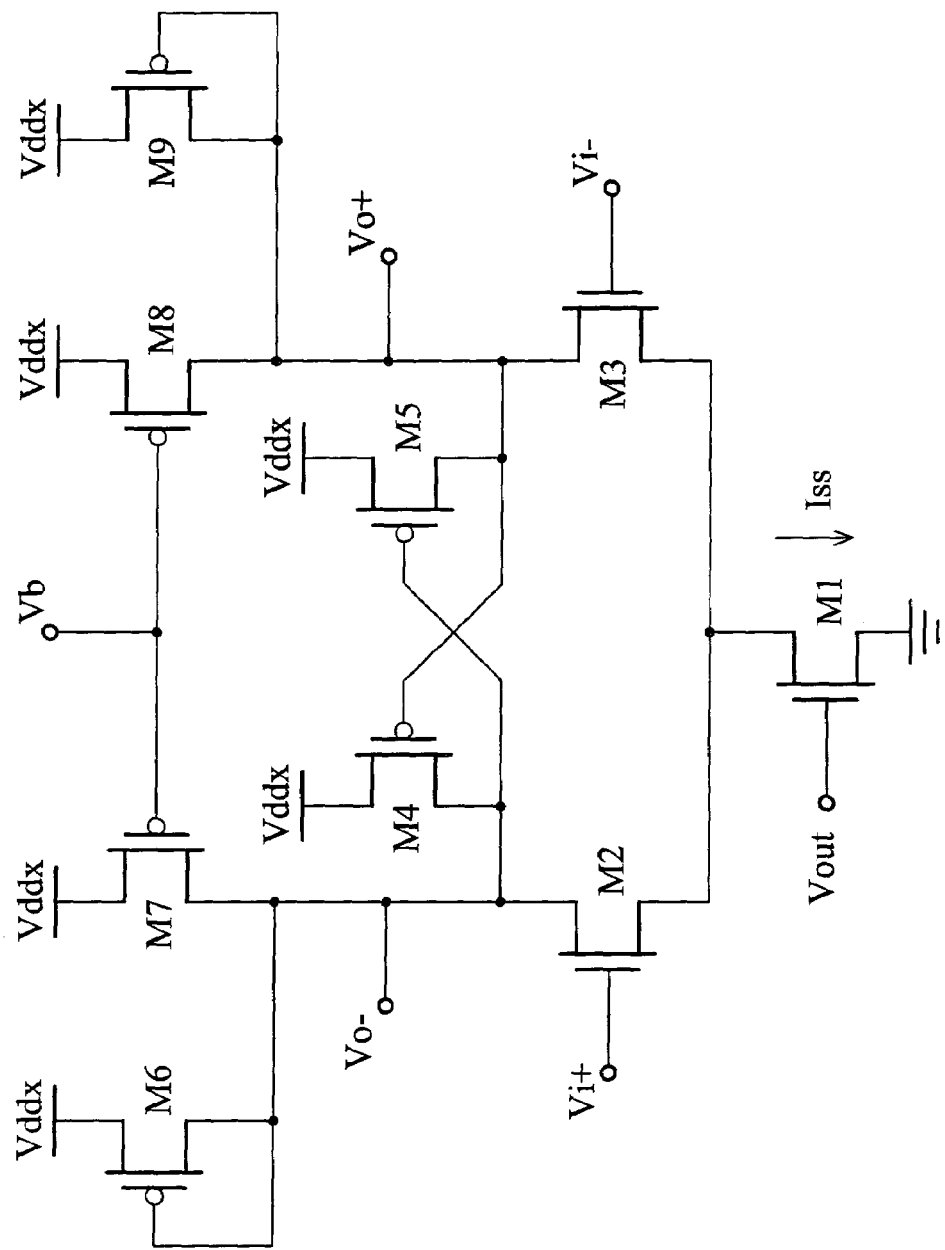
FIG. 38B is a schematic diagram illustrating the circuit of the differential delay unit 260.
Figure 39:
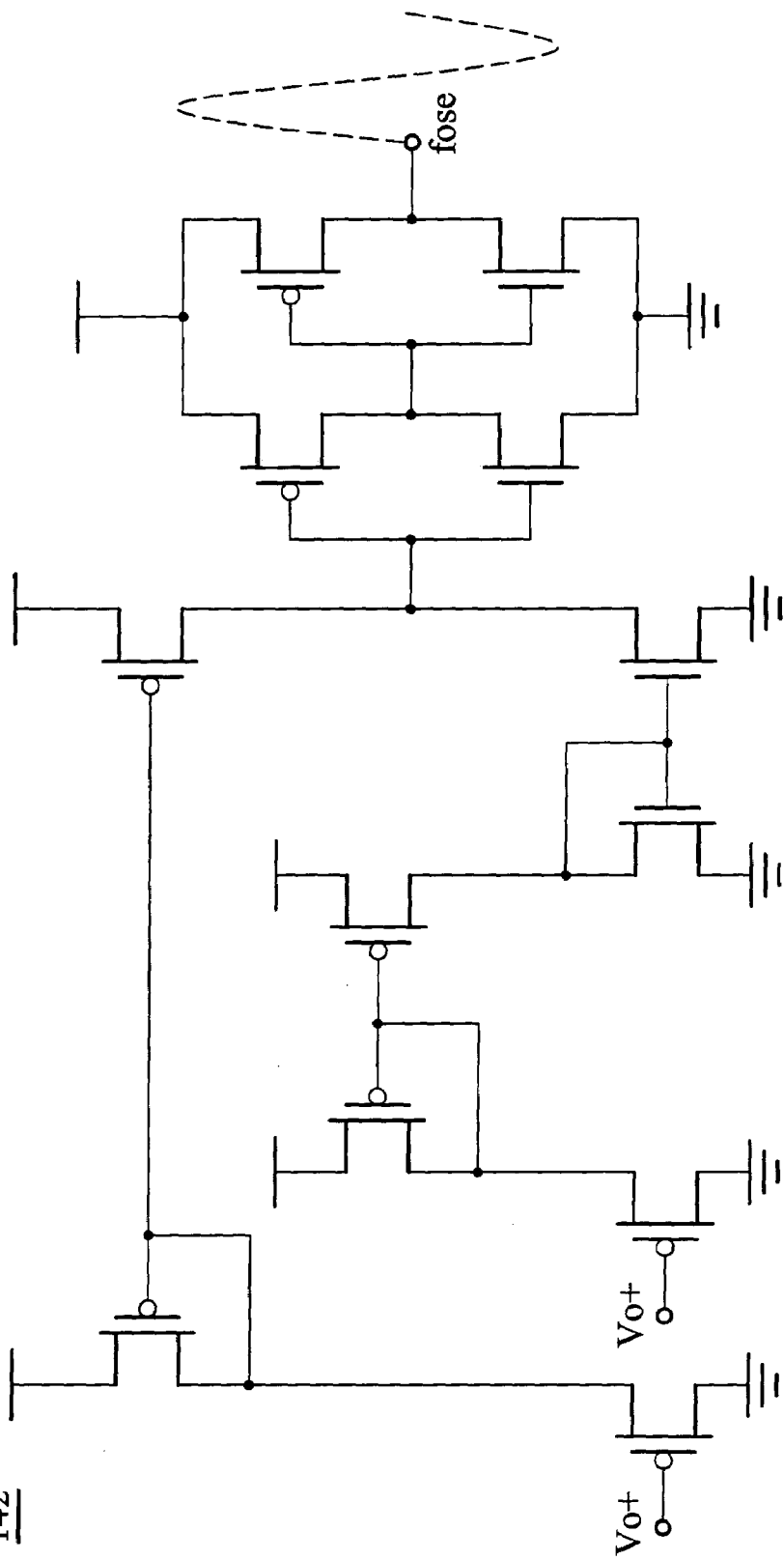
FIG. 39 is a schematic diagram illustrating the circuit of the differential single-end converter 142.

FIG. 38B is a schematic diagram illustrating the circuit of the differential delay unit 260. The delay time of the differential delay unit 260 is controlled by the bias current of the transistor M1, in other words, the oscillation frequency of the voltage control oscillator 140 is controlled by the bias current of the transistor M1. The oscillation frequency $f_{osc}=1/(2Nt_d) \cong I_{ss}/2NC_L V_{SW}$ wherein CL is the load capacitance (parasitical capacitance) of each differential delay unit 260. The control voltage Vcnt decides the current ISS of the transistor M1 and also controls the oscillation frequency. The oscillation amplitude VSW of the differential delay unit 260 is decided and limited by the bias Vb generated by the replica circuit (not shown in the drawings) of the differential delay unit and a negative loop circuit (not shown in drawings). The differential delay unit transistors M6, M7, M8, and M9 constitute the symmetric load having the symmetric current-to-voltage conversion characteristics and avoiding the common mode noise well. The cross coupling transistors M4 and M5 can increase the symmetry of load and decrease the noise of phase. The sources of the load transistors M4, M5, M6, M7, and M8 are coupled to the stable operating voltage Vddx. Therefore, the oscillation frequency of the voltage control oscillator 140 is more stable and will not affected by the voltage source FIG. 39 is a schematic diagram illustrating the circuit of the differential single-end converter 142. The differential single-end converter 142 converts the differential signal of the voltage control oscillator 140 to a single-end signal. The differential single-end converter 142 adds a buffer at the output stage to provide the prescaler 150 and the delay circuit 160 with a full amplitude oscillation signal. Another object of the differential single-end converter 142 is to isolate the output end of the voltage control oscillator 140 and avoid affecting the normal operation of the voltage control oscillator 140.

Figure 40:
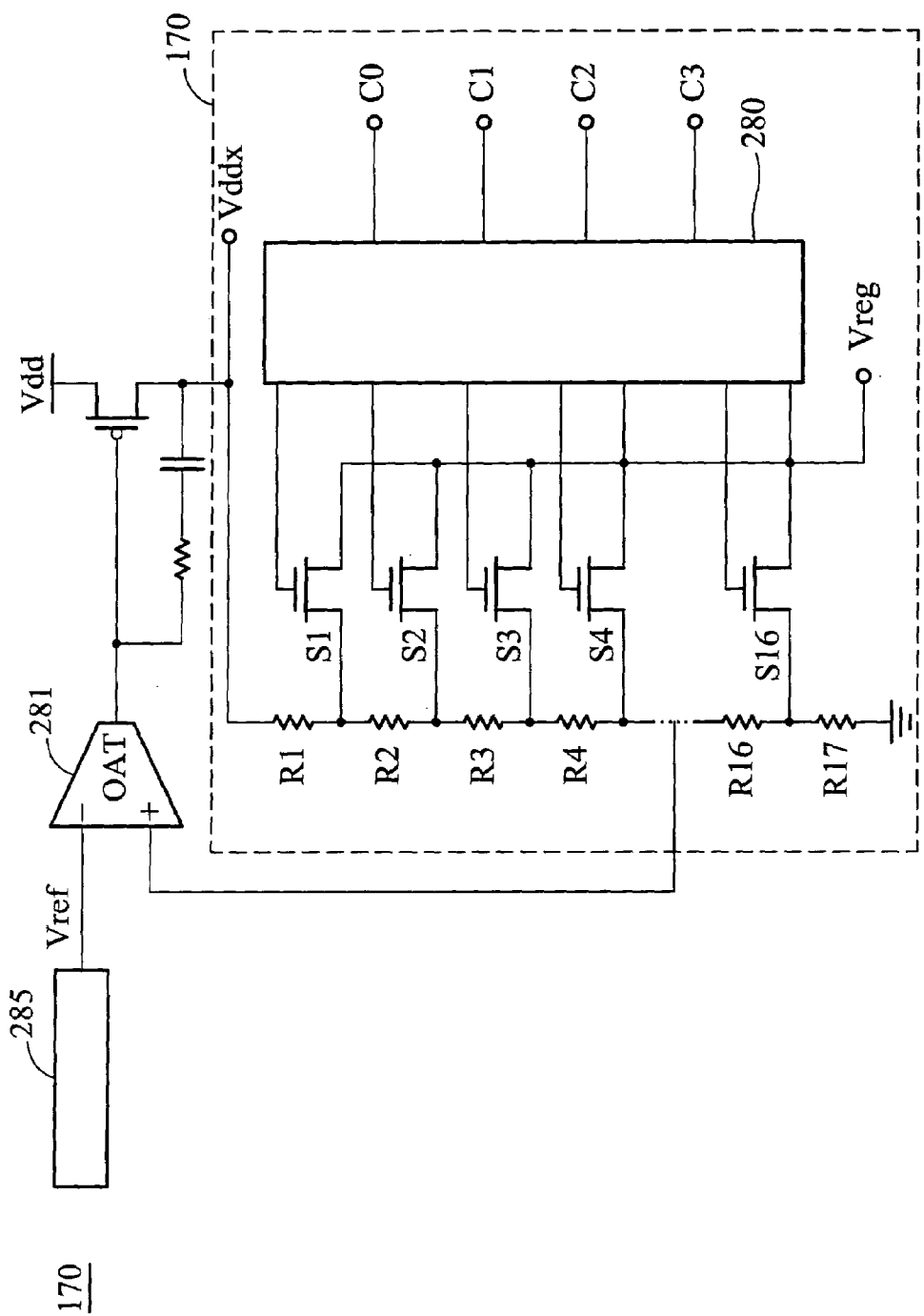
FIG. 40 is a schematic diagram illustrating the circuit of the first programmable controller 170.

FIG. 40 is a schematic diagram illustrating the circuit of the first programmable controller 170. The first programmable controller 170 comprises: a resistor serial having a plurality of resistors R1 to R17, coupled to the operating voltage Vddx, and generating the second voltage Vreg from the output end; a plurality of switches S1 to S16 coupled to the corresponding connection points of the plurality of resistors and the output end of the first programmable controller; and a decoder 280 receiving the first digital code to select the corresponding switch and adjust the second voltage Vreg to meet the requirement of the oscillation frequency. The voltage regulation circuit 180 receives the reference voltage Vref and generates the operating voltage Vddx, so that both the operating voltage Vddx and the second reference voltage Vreg are stable voltages without effects of the voltage source. The first programmable controller 170 can be used as a coarse-tuner in the digital adjustable chip oscillator.

Figure 41:
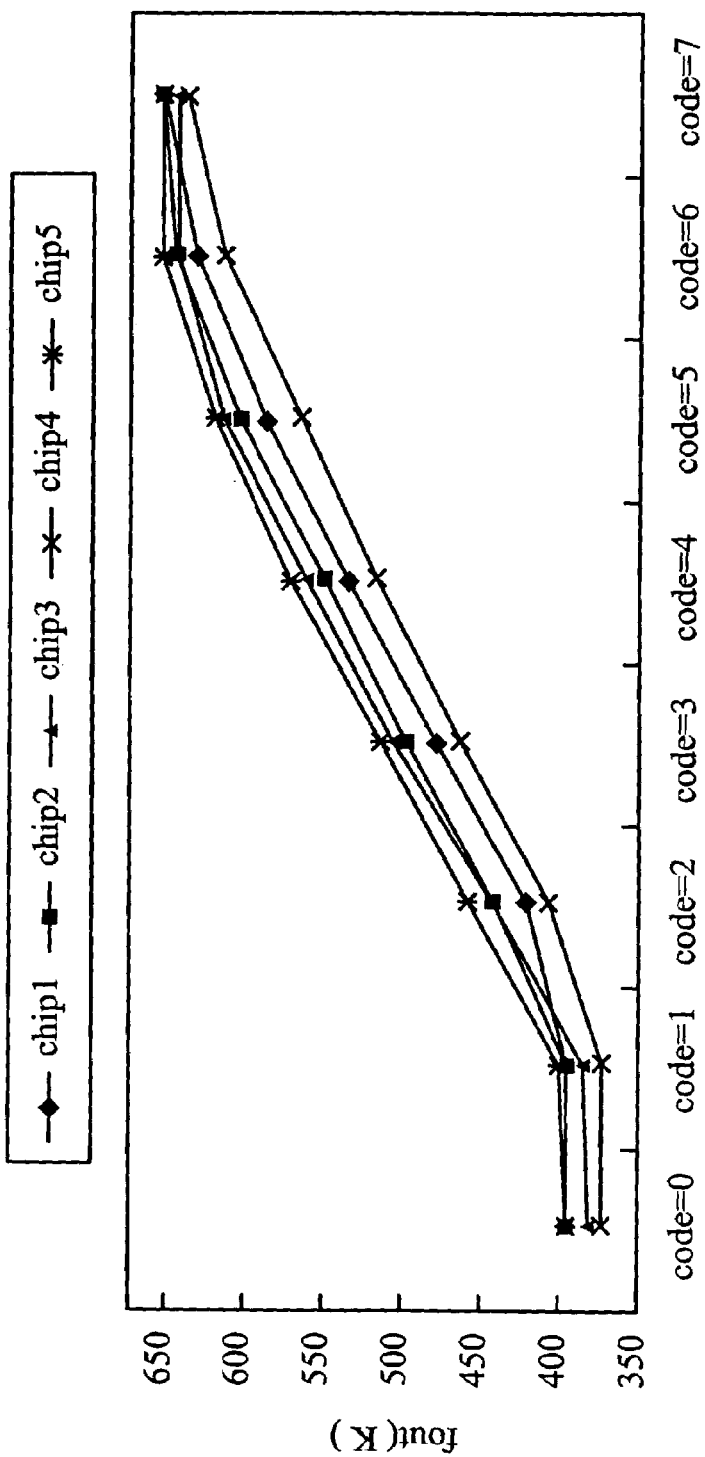
FIG. 41 is a graph illustrating the test results of the voltage control oscillator 140 when the digital code varies.

FIG. 41 is a graph illustrating the test results of the voltage control oscillator 140 when the digital code varies. As shown in FIG. 41, the conversion relationship of the oscillation frequency and the digital code is linear. The frequency shifts slightly among the voltage control oscillators 140 of different chips. The frequency shifts can be adjusted by the second programmable controller 172.

Figure 42:
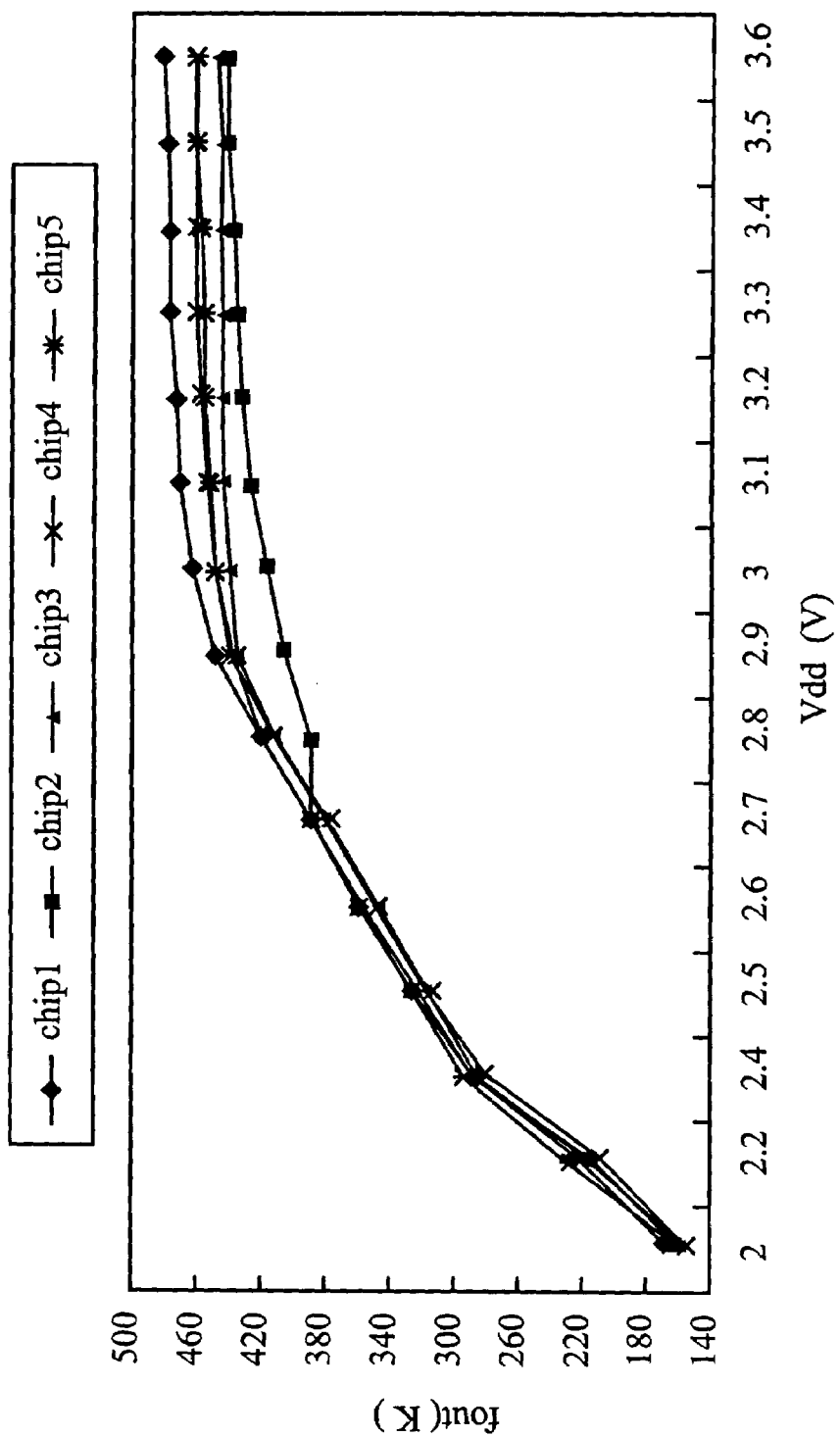
FIG. 42 is a graph illustrating the test results of the voltage control oscillator 140 when the voltage source varies.

FIG. 42 is a graph illustrating the test results of the voltage control oscillator 140 when the voltage source varies. As shown in FIG. 42, the voltage source affects the oscillation frequency to a very limited extent.

Figure 43:
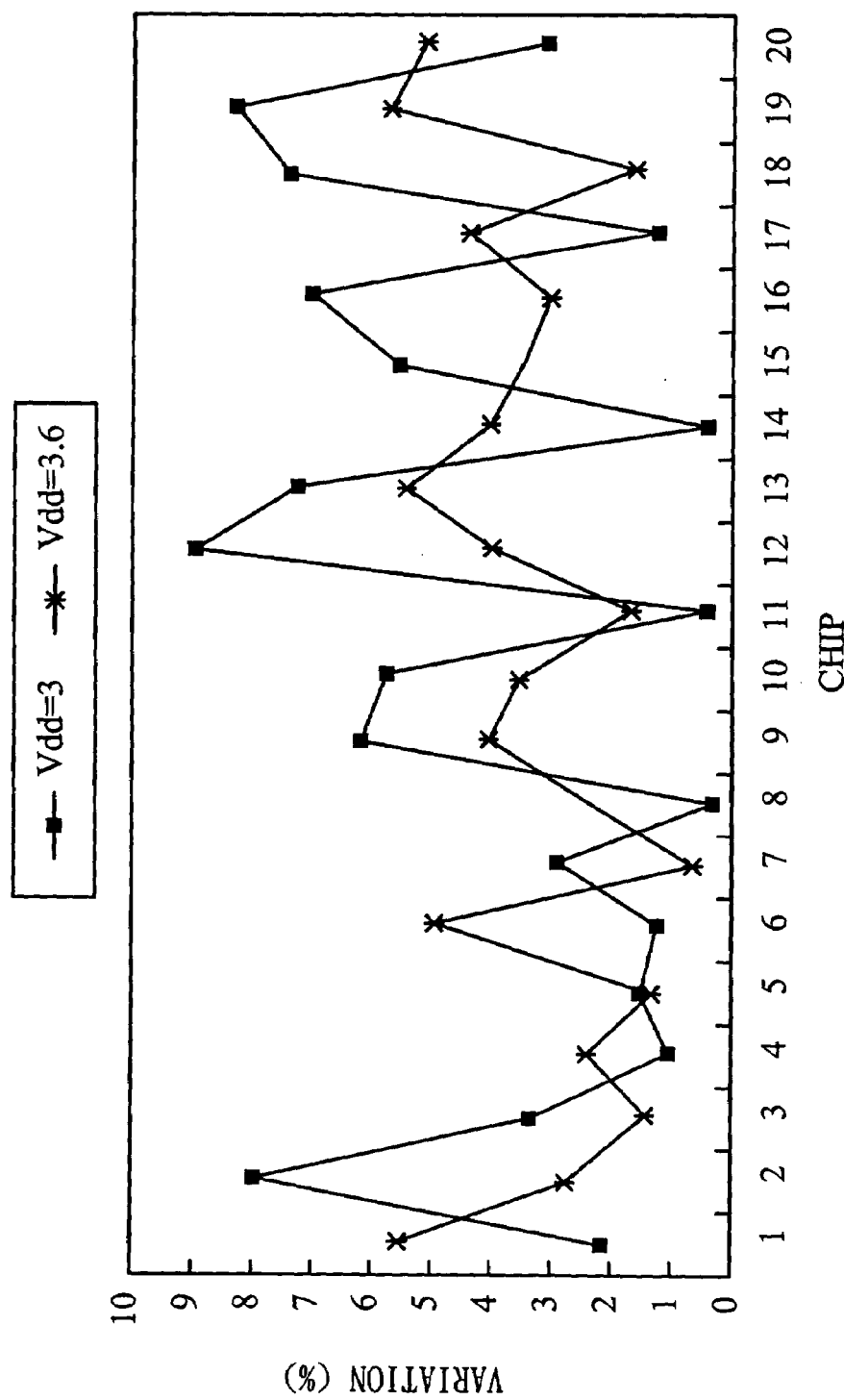
FIG. 43 is a graph illustrating the frequency shift caused by the chip.

FIG. 43 is a graph illustrating the frequency shift caused by the chip. As shown in FIG. 43, for different chips, the frequency shifts are no more than 10 percentages when the voltage source Vdd is 3 volts and 3.6 volts respectively.

The test structures of the first and second embodiments are the same. In the test structure of the second embodiment, the chip oscillator with loop circuits 200 is integrated into the test structure in FIG. 9. The steps of testing and writing in the second embodiment are the same as those in the first embodiment. The programmable counter 60 in FIG. 9 outputs the digital code to the first programmable controller and the second programmable controller and thus adjusts the oscillation frequency to be the desired frequency.

While the invention has been described by way of example and in terms of the preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A digital adjustable chip oscillator, comprising:
   a voltage control oscillator generating an oscillation signal, receiving a control voltage to adjust the frequency of the oscillation signal, and receiving an operating voltage to stabilize the frequency of the oscillation signal;
   a reference voltage circuit generating a reference voltage;
   a voltage regulation circuit receiving the reference voltage and generating the operating voltage;
   a digital tuning circuit receiving a digital code to adjust the control voltage and receiving the operating voltage to stabilize the control voltage;
   a frequency detector receiving the oscillation signal, a first reference signal with a first frequency, and a second reference signal with a second frequency, wherein when the oscillation frequency lies between the first frequency and the second frequency, the frequency detector will output a high voltage comparison signal, otherwise the frequency detector will output a low voltage comparison signal;

a programmable counter receiving a clock signal to trigger the counting and generating the digital code;

a programmable controller receiving the high voltage comparison signal to generate an enable signal directing the frequency detector to hold the high voltage comparison signal and directing the programmable counter to stop counting and hold the digital code; and a programmable memory receiving the enable signal to record the digital code.

2. The digital adjustable chip oscillator as claimed in claim 1, wherein the voltage control oscillator is a relaxation oscillator.

3. The digital adjustable chip oscillator as claimed in claim 1, wherein the reference voltage circuit is a bandgap reference voltage circuit.

4. The digital adjustable chip oscillator as claimed in claim 1, further comprising a prescaler receiving the oscillation signal and generating a period dividing signal according to a period dividing code.

5. The digital adjustable chip oscillator as claimed in claim 1, wherein the voltage regulation circuit comprises:
   an operational transconductance amplifier receiving the reference voltage, receiving a loop voltage, and outputting a bias voltage;
   a transistor receiving the bias voltage, outputting a current, and outputting the operating voltage; and
   a loop circuit receiving the current and outputting the loop voltage.

6. The digital adjustable chip oscillator as claimed in claim 1, wherein the digital tuning circuit further comprises:
   an operational transconductance amplifier receiving the reference voltage, receiving a loop voltage, and outputting a bias voltage;
   a transistor receiving the bias voltage, outputting a reference current, and proportioning corresponding bias currents of the plurality of current mirrors to the reference current wherein the bias voltage is coupled to the plurality of current mirrors; and
   a loop circuit receiving the reference current and outputting the loop voltage.

7. The digital adjustable chip oscillator as claimed in claim 1, wherein the digital tuning circuit further comprises:
   a plurality of charge current mirrors receiving a bias voltage to generate a plurality of charge bias currents corresponding to the bit of the digital code and receiving the operating voltage to stabilize the plurality of bias currents;
   a plurality of discharge current mirrors receiving the bias voltage to generate a plurality of discharge bias currents corresponding to the bit of the digital code;
   a transistor receiving the plurality of bias currents to generate the control voltage;
   a plurality of first switches coupled to the plurality of charge current mirrors and the transistor and receiving the digital code to select the plurality of charge current minors; and
   a plurality of second switches coupled to the plurality of discharge current mirrors and the transistor and receiving the digital code to select the plurality of discharge current mirrors.

8. The digital adjustable chip oscillator as claimed in claim 1, wherein the programmable memory is a programmable gate writer.

9. The digital adjustable chip oscillator as claimed in claim 1, wherein the frequency detector comprises:
   a first phase frequency detector receiving the first reference signal, receiving the oscillation signal, and generating a first detection signal;
   a first low-pass filter receiving the first detection signal and outputting the dc component of the first detection signal;
   a first comparator receiving the dc component of the first detection signal and generating a first comparison signal wherein when the first frequency lies above the oscillation frequency, the first comparison signal is high-level, otherwise the first comparison signal is low-level;
   a second phase frequency detector receiving the second reference signal, receiving the oscillation signal, and generating a second detection signal;
   a second low-pass filter receiving the second detection signal and outputting the dc component of the second detection signal;
   a second comparator receiving the dc component of the second detection signal and generating a second comparison signal wherein when the second frequency lies above the oscillation frequency, the second comparison signal is high-level, otherwise the second comparison signal is low-level; and
   an exclusive gate receiving the first comparison signal, receiving the second comparison signal, and generating the comparison signal.

10. The digital adjustable chip oscillator as claimed in claim 9, wherein the first low-pass filter and the second low-pass filter are both switch capacitance filters.

* * * * *